United States Patent
Nakano et al.

(10) Patent No.: US 10,666,212 B2
(45) Date of Patent: May 26, 2020

(54) DRIVER CIRCUIT AND OPTICAL TRANSMITTER

(71) Applicant: NIPPON TELEGRAPH AND TELEPHONE CORPORATION, Tokyo (JP)

(72) Inventors: Shinsuke Nakano, Tokyo (JP); Masafumi Nogawa, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/081,019

(22) PCT Filed: Mar. 15, 2017

(86) PCT No.: PCT/JP2017/010354
§ 371 (c)(1),
(2) Date: Aug. 29, 2018

(87) PCT Pub. No.: WO2017/169769
PCT Pub. Date: Oct. 5, 2017

(65) Prior Publication Data
US 2019/0068147 A1 Feb. 28, 2019

(30) Foreign Application Priority Data
Mar. 31, 2016 (JP) .................. 2016-070340

(51) Int. Cl.
*H03F 3/04* (2006.01)
*H03F 3/68* (2006.01)
(Continued)

(52) U.S. Cl.
CPC ............ *H03F 3/68* (2013.01); *H03F 1/0283* (2013.01); *H03F 3/20* (2013.01); *H03F 3/2171* (2013.01);
(Continued)

(58) Field of Classification Search
CPC ...... H03F 3/68; H03F 3/45192; H03F 3/2171; H03F 3/20; H03F 3/45; H03F 3/04;
(Continued)

(56) References Cited

U.S. PATENT DOCUMENTS 3,999,139 A 12/1976 Fennell
5,155,614 A 10/1992 Carmen et al.
(Continued)

FOREIGN PATENT DOCUMENTS

CN 1244067 A 2/2000
DE 19600194 A1 11/1996
(Continued)

OTHER PUBLICATIONS

D.W. Kim et al., "12.5-Gb/s analog front-end of an optical transceiver in 0.13-μm CMOS," ISCAS 2013.
(Continued)

*Primary Examiner* — Khanh V Nguyen
(74) *Attorney, Agent, or Firm* — Womble Bond Dickinson (US) LLP

(57) ABSTRACT

A positive-side power supply terminal (1-1a) of a differential amplifier (1-1) is connected to a positive-side power supply line (L1). A negative-side power supply terminal (1-2b) of a differential amplifier (1-2) is connected to a negative-side power supply line (L2). A negative-side power supply terminal (1-1b) of the differential amplifier (1-1) and a positive-side power supply terminal (1-2a) of the differential amplifier (1-2) are connected to each other. A final-stage amplifier (2) is connected between the positive-side power supply line (L1) and the negative-side power supply line (L2).

20 Claims, 21 Drawing Sheets

(51) Int. Cl.
*H04B 10/50* (2013.01)
*H03F 1/02* (2006.01)
*H03F 3/45* (2006.01)
*H03F 3/20* (2006.01)
*H03F 3/217* (2006.01)

(52) U.S. Cl.
CPC ........... *H03F 3/45* (2013.01); *H03F 3/45192* (2013.01); *H04B 10/50* (2013.01); *H03F 2200/405* (2013.01); *H03F 2200/408* (2013.01); *H03F 2200/516* (2013.01)

(58) Field of Classification Search
CPC ...... H03F 3/10; H03F 3/45085; H03F 1/3211; H03F 3/45071; H03F 3/45183; H03F 3/45179; H04B 10/50; H01L 29/00
USPC .......................................... 330/250, 252, 253
See application file for complete search history.

(56) References Cited

U.S. PATENT DOCUMENTS

| | | | |
|---|---|---|---|
| 5,706,117 | A | 1/1998 | Imai et al. |
| 5,889,432 | A | 3/1999 | Ho |
| 6,392,454 | B1 | 5/2002 | Okanobu |
| 8,212,615 | B2 | 7/2012 | Masuda et al. |
| 2006/0226902 | A1 | 10/2006 | White et al. |
| 2008/0265995 | A1 | 10/2008 | Okamoto et al. |
| 2009/0295480 | A1 | 12/2009 | Ikeda et al. |
| 2010/0214019 | A1 | 8/2010 | Christensen |
| 2010/0271122 | A1 | 10/2010 | Masuda et al. |
| 2011/0050340 | A1 | 3/2011 | Sun et al. |
| 2015/0171804 | A1 | 6/2015 | Hwang et al. |
| 2015/0372652 | A1* | 12/2015 | Kitamura ................ H03F 3/193 330/253 |
| 2016/0006395 | A1* | 1/2016 | Kim ..................... H03F 1/0205 330/261 |
| 2017/0093349 | A1* | 3/2017 | Elliott ................... H03F 1/0233 |

FOREIGN PATENT DOCUMENTS

| | | |
|---|---|---|
| EP | 0963038 A2 | 12/1999 |
| EP | 2685630 A1 | 1/2014 |
| JP | H08-316580 A | 11/1996 |
| JP | H11-163645 A | 6/1999 |
| JP | H11-346125 A | 12/1999 |
| JP | 2000-221456 A | 8/2000 |
| JP | 2002-252523 A | 9/2002 |
| JP | 2003-092520 A | 3/2003 |
| JP | 2008-536445 A | 9/2008 |
| JP | 2008-277882 A | 11/2008 |
| JP | 2010-258867 A | 11/2010 |
| KR | 10-2000-0005731 A | 1/2000 |
| KR | 10-0288593 B1 | 2/2001 |
| WO | 2006/112957 A2 | 10/2006 |

OTHER PUBLICATIONS

Written Opinion received for PCT Patent Application No. PCT/JP2017/010354, dated Jun. 6, 2017, 16 pages (10 pages of English Translation and 6 pages of Original Document).

International Search Report received for PCT Patent Application No. PCT/JP2017/010354, dated Jun. 6, 2017, 5 pages (2 pages of English Translation and 3 pages of Original Document).

International Preliminary Report on Patentability received for PCT Patent Application No. PCT/JP2017/010354, dated Oct. 11, 2018, 19 pages (12 pages of English Translation and 7 pages of Original Document).

Partial European Search Report and Provisional Opinion received for EP Patent Application No. 17774313.5, dated Sep. 20, 2019, 15 pages.

* cited by examiner

DRIVER CIRCUIT AND OPTICAL TRANSMITTER

TECHNICAL FIELD

The present invention relates to a driver circuit for driving an optical modulator and the like used in an optical transmitter of an optical communication system, and the optical transmitter.

BACKGROUND ART

A driver circuit for driving an optical modulator needs to amplify an electrical signal with a small amplitude (for example, about several hundred mV) to a large amplitude (for example, about several V) with which the optical modulator can be driven, and output the electrical signal. This driver circuit desirably has both a large gain characteristic and a wide-band characteristic, and is generally implemented by a group of multistage amplifiers that are connected.

FIG. 29 shows the main part of a related driver circuit. A driver circuit 300 gradually amplifies the amplitude of an input signal $V_{in}$ using preamplifiers 11-1 and 11-2 and an output-stage amplifier 12, and outputs an output signal $V_{out}$ having a desired amplitude. This eliminates the need to increase a gain for an amplifier of each stage, thereby implementing a wide band characteristic in each amplifier. Therefore, it is possible to obtain a driver circuit, as a whole, having both a large gain characteristic and a wide band characteristic.

In general, as a necessary output amplitude increases, a power supply voltage necessary for an amplifier increases as well. Thus, a power supply voltage that is necessary to drive each amplifier becomes higher in a later-stage amplifier. In the driver circuit 300 shown in FIG. 29, positive-side power supply terminals 11-1a and 11-2a of the preamplifiers 11-1 and 11-2 are connected to a supply line (positive-side power supply line) LA of a power supply voltage $V_1$, and negative-side power supply terminals 11-1b and 11-2b of the preamplifiers 11-1 and 11-2 are connected to a ground line (negative-side power supply line) GND. In addition, a positive-side power supply terminal 12a of the output-stage amplifier 12 is connected to a supply line (positive-side power supply line) LB of a power supply voltage $V_2$ ($V_1<V_2$), and a negative-side power supply terminal 12b of the output-stage amplifier 12 is connected to the ground line (negative-side power supply line) GND. With this, the power supply voltage $V_1$ is supplied between the positive-side power supply terminals 11-1a and 11-2a and negative-side power supply terminals 11-1b and 11-2b of the preceding-side amplifiers 11-1 and 11-2, and the power supply voltage $V_2$ is supplied between the positive-side power supply terminal 12a and negative-side power supply terminal 12b of the output-stage amplifier 12.

Note that non-patent literature 1 describes a circuit arrangement of decreasing the power consumption of a driver circuit by driving, with a power supply voltage lower than that of an output-stage amplifier, an amplifier provided in the preceding stage where a relatively small amplitude is processed.

In the driver circuit 300 shown in FIG. 29, assuming that if all amplifiers (the preamplifiers 11-1 and 11-2 and the output-stage amplifier 12) are driven by the power supply voltage $V_2$, the current consumption of each amplifier remains unchanged, the power consumption is given by $V_2 \times (2I_1 + I_2)$. However, if the preamplifiers 11-1 and 11-2 are driven by the power supply voltage $V_1$, it is possible to reduce the power consumption by $(V_2 - V_1) \times 2I_1$.

RELATED ART LITERATURE

Non-Patent Literature

Non-Patent Literature 1: D. W. Kim et al., "12.5-Gb/s analog front-end of an optical transceiver in 0.13-μm CMOS," ISCAS 2013

DISCLOSURE OF INVENTION

Problem to be Solved by the Invention

However, when a driver circuit is mounted on a module, a single power supply voltage may only be supplied to improve the convenience of the module. In this case, to operate amplifiers forming the driver circuit mounted on the module, power supply circuits with the number of which corresponds to that of power supply voltages necessary for the respective amplifiers are required.

For example, when a power supply circuit necessary for each amplifier is implemented by a switching regulator circuit, it is difficult to mount the circuit on the same integrated circuit as that of the driver circuit due to a large circuit size, and it is thus necessary to prepare the switching regulator circuit as a separate device. Hence, costs of components and implementation becomes greater.

On the other hand, when a power supply circuit necessary for each amplifier is implemented by a series regulator circuit, it is possible to mount the power supply circuit on the same integrated circuit as that of a modulator driver. However, the above-described effect of reducing the power consumption by $(V_2 - V_1) \times 2I_1$ is lost, and it is thus difficult to perform a lower power consumption operation of the driver circuit.

As described above, when the relevant driver circuit is operated with one power supply voltage, power supply circuits with the number of which corresponds to that of power supply voltages necessary for the respective amplifiers are required. This causes a problem of difficulties in performing a lower power consumption operation of the driver circuit while suppressing costs of components and implementation.

The present invention has been made in consideration of the above problem, and has as its object to provide a driver circuit that operates by receiving a single power supply voltage, and can perform a lower power consumption operation while suppressing costs of components and implementation.

Means of Solution to the Problem

According to the present invention, there is provided a driver circuit including a plurality of amplifiers cascade-connected so as to sequentially amplify an input signal, the plurality of amplifiers each including a positive-side power supply terminal and a negative-side power supply terminal, wherein the plurality of amplifiers except for the final-stage amplifier among the plurality of amplifiers is connected to a positive-side power supply line and a negative-side power supply line in one of a first connection form and a second connection form, the final-stage amplifier has the negative-side power supply terminal connected to the negative-side power supply line, the first connection form is a form in which the positive-side power supply terminal of the first-stage amplifier is connected to the positive-side power supply line, the negative-side power supply terminal of the amplifier immediately preceding the final-stage amplifier is connected to the negative-side power supply line, and, as for the amplifiers from the first-stage amplifier to the amplifier immediately preceding the final-stage amplifier, the negative-side power supply terminal of the preceding-stage amplifier and the positive-side power supply terminal of the adjacent succeeding-stage amplifier are connected to each other, and the second connection form is a form in which the negative-side power supply terminal of the first-stage amplifier is connected to the negative-side power supply line, the positive-side power supply terminal of the amplifier immediately preceding the final-stage amplifier is connected to the positive-side power supply line, and, as for the amplifiers from the first-stage amplifier to the amplifier immediately preceding the final-stage amplifier, the positive-side power supply terminal of the preceding-stage amplifier and the negative-side power supply terminal of the adjacent succeeding-stage amplifier are connected to each other.

Effect of the Invention

According to the present invention, a plurality of amplifiers except for a final-stage amplifier are connected to a positive-side power supply line and a negative-side power supply line in one of a first connection form and a second connection form. In the first connection form, the positive-side power supply terminal of the first-stage amplifier is connected to the positive-side power supply line, the negative-side power supply terminal of the amplifier immediately preceding the final-stage amplifier is connected to the negative-side power supply line, and, as for the amplifiers from the first-stage amplifier to the amplifier immediately preceding the final-stage amplifier, the negative-side power supply terminal of the preceding-stage amplifier and the positive-side power supply terminal of the adjacent succeeding-stage amplifier are connected to each other. In the second connection form, the negative-side power supply terminal of the first-stage amplifier is connected to the negative-side power supply line, the positive-side power supply terminal of the amplifier immediately preceding the final-stage amplifier is connected to the positive-side power supply line, and, as for the amplifiers from the first-stage amplifier to the amplifier immediately preceding the final-stage amplifier, the positive-side power supply terminal of the preceding-stage amplifier and the negative-side power supply terminal of the adjacent succeeding-stage amplifier are connected to each other. In the present invention, with this arrangement, it is possible to implement a circuit arrangement which can be driven by a single power supply voltage and in which a higher power supply voltage is supplied to a later-stage amplifier, thereby capable of performing a lower power consumption operation while suppressing costs of components and implementation.

BEST MODE FOR CARRYING OUT THE INVENTION

Embodiments of the present invention will be described in detail below with reference to the accompanying drawings.

First Embodiment

Figure 1:
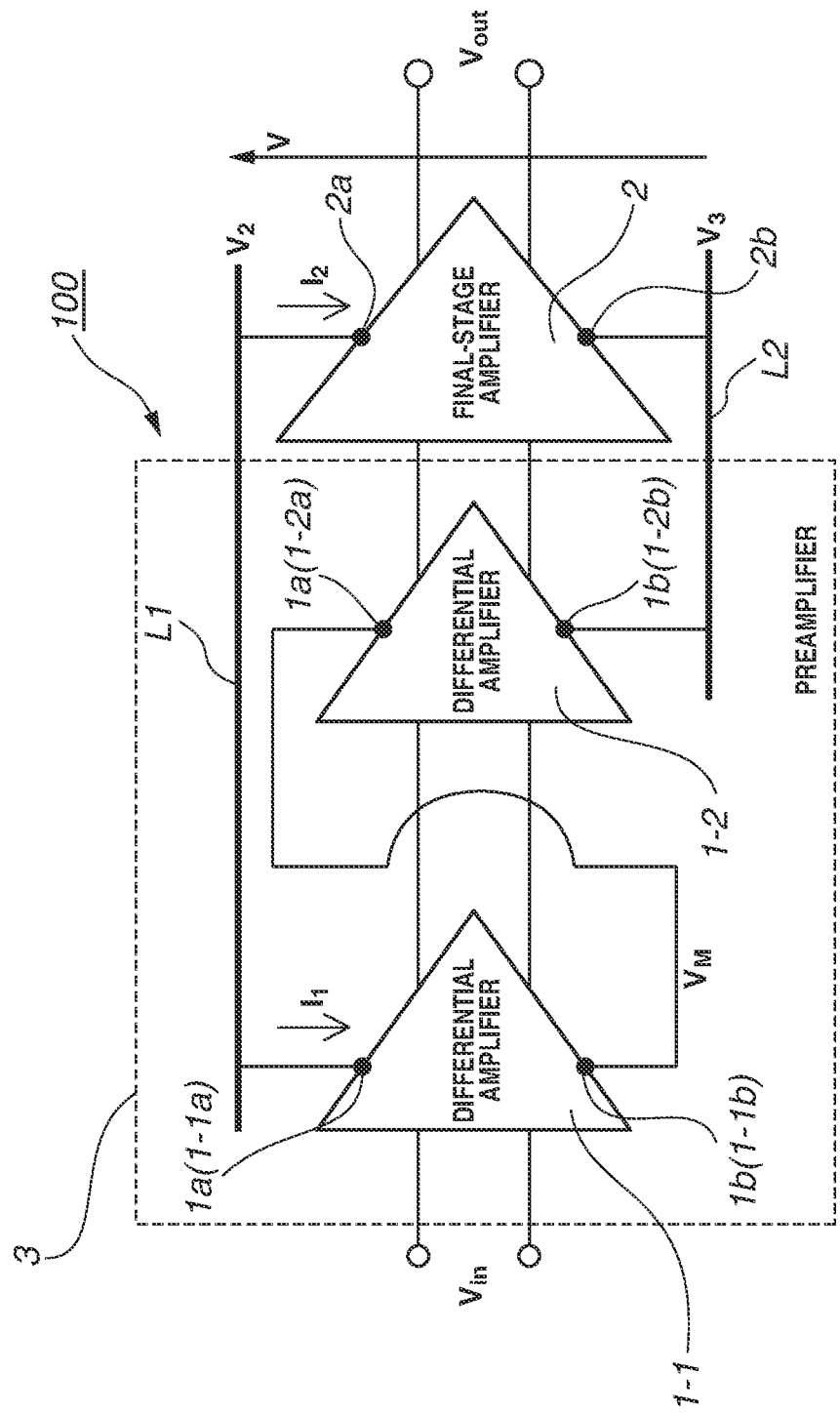
FIG. 1 is a circuit diagram showing the main part of a driver circuit according to the first embodiment of the present invention.

FIG. 1 is a circuit diagram showing the main part of a driver circuit 100 according to the first embodiment of the present invention. The driver circuit 100 includes a plurality of amplifiers cascade-connected so as to sequentially amplify an input signal. More specifically, the driver circuit 100 includes two differential amplifiers 1 (1-1 and 1-2) and a final-stage differential amplifier 2, and operates by receiving a single power supply voltage V ($V=V_2-V_3$) supplied between a positive-side power supply line L1 and a negative-side power supply line L2.

In the driver circuit 100, each differential amplifier 1 (1-1 or 1-2) includes a positive-side power supply terminal 1a (1-1a or 1-2a) and a negative-side power supply terminal 1b (1-1b or 1-2b). The differential amplifier 2 includes a positive-side power supply terminal 2a and a negative-side power supply terminal 2b.

The first embodiment shows an example of a first connection form. In the first connection form, the differential amplifiers 1-1 and 1-2 are connected in series between the positive-side power supply line L1 and the negative-side power supply line L2 by connecting the positive-side power supply terminal 1-1a of the differential amplifier 1-1 to the positive-side power supply line L1, connecting the negative-side power supply terminal 1-2b of the differential amplifier 1-2 to the negative-side power supply line L2, and connecting the negative-side power supply terminal 1-1b of the differential amplifier 1-1 and the positive-side power supply terminal 1-2a of the differential amplifier 1-2 to each other. The differential amplifier 2 is connected between the positive-side power supply line L1 and the negative-side power supply line L2 by connecting the local positive-side power supply terminal 2a to the positive-side power supply line L1, and connecting the local negative-side power supply terminal 2b to the negative-side power supply line L2.

A two-stage preamplifier 3 is formed by the differential amplifiers 1-1 and 1-2. The differential amplifier 1-1 is set as a first-stage amplifier and the differential amplifier 1-2 is set as a second-stage amplifier.

In this driver circuit 100, the differential amplifier 1-1 amplifies an input signal $V_{in}$, and sends the amplified signal to the differential amplifier 1-2. The differential amplifier 1-2 further amplifies the amplified signal received from the differential amplifier 1-1, and sends the further amplified signal to the differential amplifier 2. The differential amplifier 2 yet further amplifies the amplified signal received from the differential amplifier 1-2, and outputs the yet further amplified signal as an output signal $V_{out}$.

This driver circuit 100 can have a circuit arrangement in which a power supply voltage V ($V=V_2-V_3$) supplied to the differential amplifier 2 is set as the highest, and the power supply voltage increases in the order of the differential amplifier 1-1 and the differential amplifier 1-2. That is, it is possible to implement a circuit arrangement which can be driven by a single power supply voltage V ($V=V_2-V_3$) and in which a higher power supply voltage is supplied to a later-stage amplifier. This eliminates the need for power supply circuits with the number of which corresponds to that of power supply voltages necessary for the respective amplifiers, thereby capable of performing a lower power consumption operation while suppressing costs of components and implementation.

For the sake of simplicity, the following description assumes a case in which the negative-side power supply line L2 of the driver circuit 100 is grounded, that is, the potential $V_3$ of the negative-side power supply line L2 is set to 0 V and the power supply voltage V is given by $V=V_2$. Note that the power supply voltage V is also given by $V=V_2$ in other embodiments (to be described later).

In the driver circuit 100, the differential amplifiers 1-1 and 1-2 are connected in series between the positive-side power supply line L1 and the negative-side power supply line L2. So that the current $I_1$ flowing into the differential amplifier 1-1 also flows into the differential amplifier 1-2. The current $I_2$ flows into the differential amplifier 2.

As compared to a case in which all the amplifiers 1-1, 1-2, and 2 are driven by the power supply voltage $V_2$, the power consumption by $I_1$ in this driver circuit 100 can be reduced, thereby achieving the reduction of the power by $V_2 \times I_1$.

In this driver circuit 100, the sum of the power supply voltage necessary for the differential amplifier 1-1 and that for the differential amplifier 1-2 is compared with a power supply voltage necessary to drive the differential amplifier 2, and then the greater value, or a value equal to or greater than this greater value is set as the power supply voltage $V_2$. When the power supply voltage necessary for the differential amplifier 1-2 is represented by $V_M$, and $V_M-V_3>V_2-V_M$ is set. For example, $V_M>V_2/2$ is set. Thus, a state in which a higher power supply voltage is supplied to a later-stage amplifier can be implemented as a desired state, thereby implementing a state that is more suitable for a lower power consumption operation in the driver circuit in which a later-stage amplifier processes larger signal amplitudes.

In this driver circuit 100, since the positive-side power supply potential and negative-side power supply potential of the differential amplifier 1-1 are $V_2$ and $V_M$, respectively, the DC operating point of the output signal of the differential amplifier 1-1 is generally at a potential between $V_2$ and $V_M$, and the potential of the DC operating point of the input signal on the differential amplifier 1-2 is higher than the positive-side power supply potential $V_M$. Therefore, the differential amplifier 1-2 needs to have a circuit arrangement in which a signal of a DC operating point that has a potential higher than the positive-side power supply potential can be input to an input unit.

Figure 2:
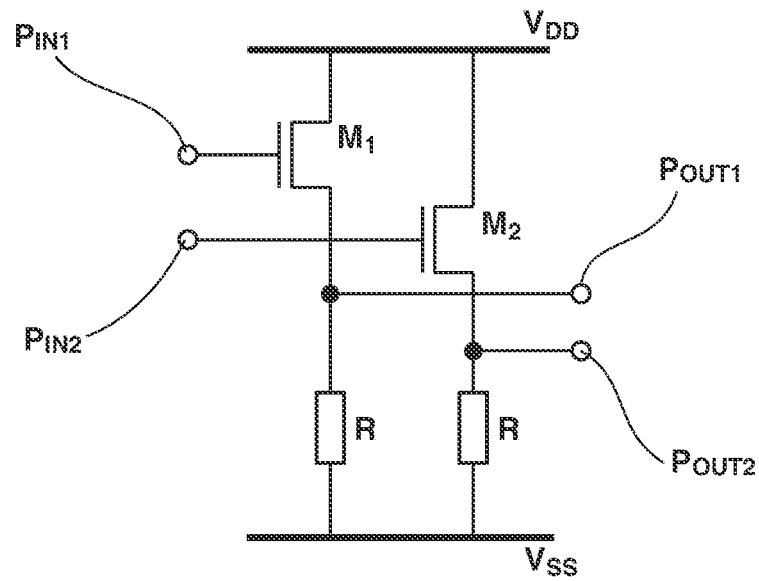
FIG. 2 is a circuit diagram showing an example of a circuit capable of receiving a signal of a DC operating point higher than a positive-side power supply potential.

An example of a circuit in which a signal of a DC operating point that has a potential higher than the positive-side power supply potential can be input is a source-follower circuit shown in FIG. 2. The source-follower circuit shown in FIG. 2 includes, for example, input terminals $P_{IN1}$ and $P_{IN2}$ respectively connected to the gate terminals of transistors $M_1$ and $M_2$, the drain terminals of the transistors $M_1$ and $M_2$ connected to a positive-side power supply terminal $V_{DD}$, the source terminals of the transistors $M_1$ and $M_2$ respectively connected to output terminals $P_{OUT1}$ and $P_{ouT2}$, and the source terminals of the transistors $M_1$ and $M_2$ connected to a negative-side power supply terminal $V_{SS}$ via resistors R, respectively. When the circuit shown in FIG. 2 is used as the input unit of the differential amplifier 1-2, the positive-side power supply potential $V_{DD}=V_M$ and the negative-side power supply potential $V_{SS}=V_3$ are employed.

In the circuit shown in FIG. 2, under the condition that the transistors $M_1$ and $M_2$ are operated in a saturated region, the voltages at the operating points of the input terminals $P_{IN1}$ and $P_{IN2}$ are allowed up to about $V_{DD}+V_{TH}$. Therefore, in this circuit, an input signal of a potential that is higher than the positive-side power supply potential $V_{DD}$ up to about $V_{TH}$ can be input. $V_{TH}$ represents a threshold voltage of the transistors $M_1$ and $M_2$.

In general, when the voltage of the DC operating point of the input signal is excessively higher than the positive-side power supply voltage in the amplifier, the amplification of the signal and ensuring of the breakdown voltage of elements are difficult. Thus, in the driver circuit 100 shown in FIG. 1, the output unit of the differential amplifier 1-1 is desirably a circuit that outputs a signal having a DC operating point with reference to the negative-side power supply potential ($V_M$).

Figure 3:
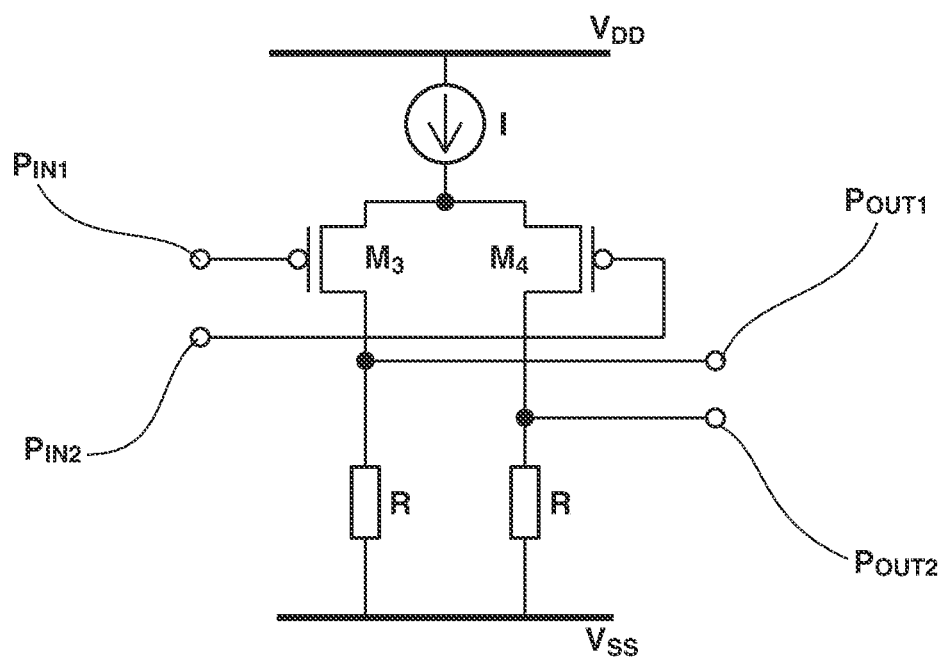
FIG. 3 is a circuit diagram showing an example of a circuit capable of outputting a signal having a DC operating point with reference to a negative-side power supply potential.

As an example of the circuit that can output a signal having a DC operating point with reference to the negative-side power supply potential, there is provided a CML circuit using p-type MOS transistors $M_3$ and $M_4$, as shown in, for example, FIG. 3. The circuit shown in FIG. 3 is capable of lowering the potentials of the output terminal $P_{OUT1}$ and $P_{OUT2}$ down to the potential of $V_{Ss}$ as a reference in an output "Low" state, and raising the potentials of the output terminal $P_{OUT1}$ and $P_{OUT2}$ up to a potential of $V_{SS}+I \cdot R$ in an output "High" state. When the circuit shown in FIG. 3 is used as the output unit of the differential amplifier 1-1, the positive-side power supply potential $V_{DD}=V_2$ and the negative-side power supply potential $V_{SS}=V_M$ are employed.

Second Embodiment

In the preamplifier 3 of the driver circuit 100 according to the first embodiment, the differential amplifier 1-1 is set as a first-stage amplifier, the differential amplifier 1-2 is set as a second-stage amplifier, the positive-side power supply terminal 1-1a of the differential amplifier 1-1 is connected to the positive-side power supply line L1, the negative-side power supply terminal 1-2b of the differential amplifier 1-2 is connected to the negative-side power supply line L2, and the negative-side power supply terminal 1-1b of the differential amplifier 1-1 and the positive-side power supply terminal 1-2a of the differential amplifier 1-2 are connected to each other.

The second embodiment will describe an example of the second connection form. In a driver circuit 200 adopting the second connection form, a differential amplifier 1-2 is set as a first-stage amplifier, a differential amplifier 1-1 is set as a second-stage amplifier, a positive-side power supply terminal 1-1a of the differential amplifier 1-1 is connected to a positive-side power supply line L1, a negative-side power supply terminal 1-2b of the differential amplifier 1-2 is connected to a negative-side power supply line L2, and a negative-side power supply terminal 1-1b of the differential amplifier 1-1 and a positive-side power supply terminal 1-2a of the differential amplifier 1-2 are connected to each other.

In this driver circuit 200, the differential amplifier 1-2 amplifies an input signal $V_{inr}$ and sends the amplified input signal to the differential amplifier 1-1. The differential amplifier 1-1 further amplifies the amplified signal received from the differential amplifier 1-2, and sends the amplified signal to the differential amplifier 2. The differential amplifier 2 further amplifies the amplified signal received from the differential amplifier 1-1, and outputs the further amplified signal as an output signal $V_{out}$.

In this driver circuit 200 as well, the sum of power supply voltage necessary for the differential amplifier 1-1 and that for the differential amplifier 1-2 is compared with a power supply voltage necessary to drive the differential amplifier 2, and then the greater value, or a value equal to or greater than this greater value is set as a power supply voltage $V_2$. In the driver circuit 200, when a power supply voltage necessary for the differential amplifier 1-2 is represented by $V_M$, and $V_M-V_3>V_2-V_M$ is set. For example, $V_M>V_2/2$ is set. Thus, a state in which a higher power supply voltage is supplied to a later-stage amplifier can be implemented as a desired state.

Note that in this driver circuit 200, a circuit (for example, a CML circuit using n-type MOS transistors) that can obtain an output signal having a DC operating point with reference to a positive-side power supply potential ($V_M$) is desirably used as the output unit of the differential amplifier 1-2, and a circuit (for example, a source-follower circuit using p-type MOS transistors) that can receive a signal having a DC operating point lower than a negative-side power supply potential ($V_M$) is required for the input unit of the differential amplifier 1-1.

Third Embodiment

In the driver circuit 100 according to the first embodiment, the amplified signal received from the differential amplifier 1-1 is directly input to the differential amplifier 1-2. In the third embodiment, a level shifter 4 that adjusts the level of a signal is provided on the input/output path of the signal between differential amplifiers 1-1 and 1-2, as indicated by a driver circuit 101 in FIG. 5. The third embodiment will describe an example of the first connection form.

As described above, there is a restriction on the driver circuit 100 of the first embodiment to have a circuit arrangement that the differential amplifier 1-2 needs to be able to receive a signal of a DC operating point that has potential higher than the positive-side power supply potential ($V_M$), and that the differential amplifier 1-1 desirably outputs a signal having a DC operating point with reference to the negative-side power supply potential ($V_M$).

In the driver circuit 101 according to the third embodiment, the level shifter 4 having an input terminal connected to the output terminal of the differential amplifier 1-1 and an output terminal connected to the input terminal of the differential amplifier 1-2 is provided, thereby canceling the above-described restriction on the DC operating points at the output terminal of the differential amplifier 1-1 and the input terminal of the differential amplifier 1-2.

Figure 5:
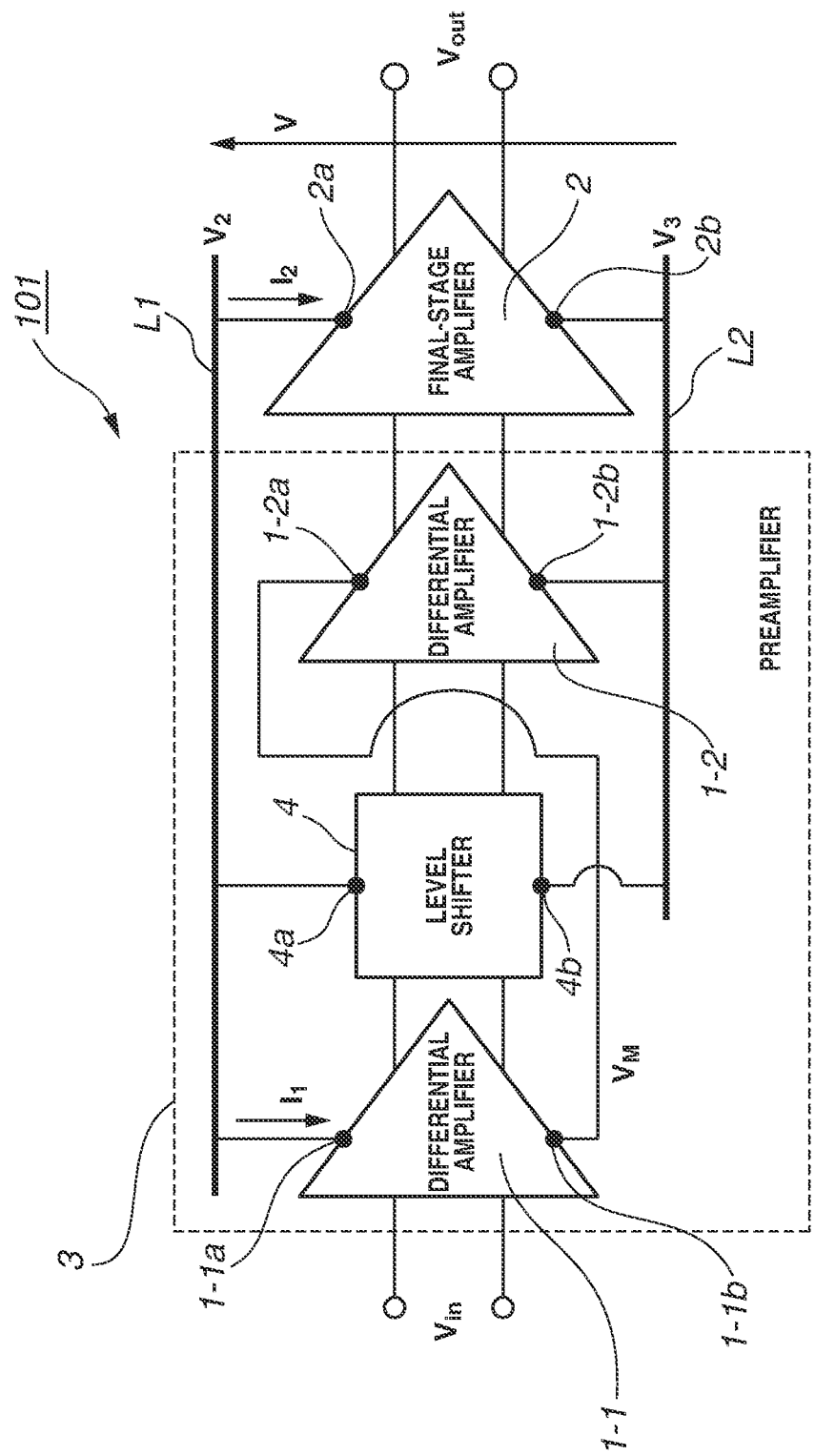
FIG. 5 is a circuit diagram showing the main part of a driver circuit according to the third embodiment of the present invention.

Since the level shifter 4 needs to generate an output signal having the DC operating point between $V_M$ and $V_3$ from an input signal having the DC operating point at a potential between $V_M$ and $V_2$, a positive-side power supply terminal 4a of the level shifter 4 is connected to a positive-side power supply terminal 1-1a (positive-side power supply line L1) of the immediately precedingly connected differential amplifier 1-1, and a negative-side power supply terminal 4b of the level shifter 4 is connected to a negative-side power supply terminal 1-2b (negative-side power supply line L2) of the immediately succeedingly connected differential amplifier 1-2, as shown in FIG. 5.

Figure 6:
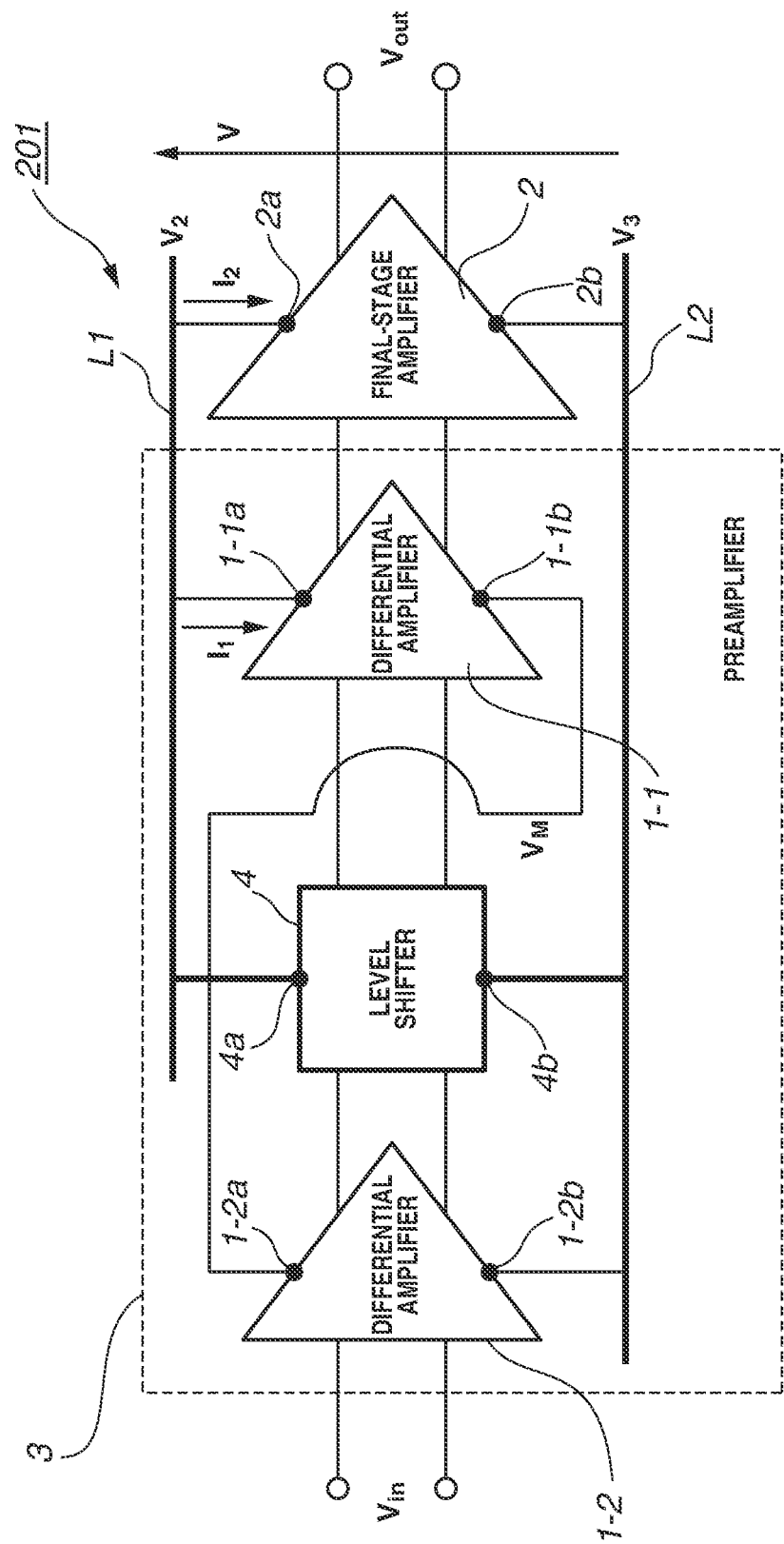
FIG. 6 is a circuit diagram showing an example in which the driver circuit of the second embodiment is provided with a level shifter.

Note that FIG. 5 shows an example in which the level shifter 4 is provided in the driver circuit 100 of the first embodiment. However, the level shifter 4 may be provided in the driver circuit 200 of the second embodiment. FIG. 6 shows an example in which the level shifter 4 is provided in the driver circuit 200 of the second embodiment. The arrangement shown in FIG. 6 is an example of the second connection form. In a driver circuit 201, the positive-side power supply terminal 4a of the level shifter 4 is connected to the positive-side power supply terminal 1-1a (positive-side power supply line L1) of the immediately succeedingly connected differential amplifier 1-1, and the negative-side power supply terminal 4b of the level shifter 4 is connected to the differential amplifier 1-2b (negative-side power supply line L2) of the immediately precedingly connected differential amplifier 1-2.

Fourth Embodiment

In the driver circuit 100 according to the first embodiment, the two-stage preamplifier 3 including the differential amplifier 1-1 as a first-stage amplifier and the differential amplifier 1-2 as a second-stage amplifier is used. In the fourth embodiment, a three-stage preamplifier 3 including a differential amplifier 1-1 as a first-stage amplifier, a differential amplifier 1-2 as a second-stage amplifier, and a differential amplifier 1-3 as a third-stage amplifier is used, as indicated by a driver circuit 102 in FIG. 7. The fourth embodiment will describe an example of the first connection form.

In this driver circuit 102, the differential amplifiers 1-1, 1-2, and 1-3 are connected in series between a positive-side power supply line L1 and a negative-side power supply line L2 by connecting a positive-side power supply terminal 1-1a of the differential amplifier 1-1 to the positive-side power supply line L1, connecting a negative-side power supply terminal 1-3b of the differential amplifier 1-3 to the negative-side power supply line L2, connecting a negative-side power supply terminal 1-1b of the differential amplifier 1-1 and a positive-side power supply terminal 1-2a of the differential amplifier 1-2 to each other, and connecting a negative-side power supply terminal 1-2b of the differential amplifier 1-2 and a positive-side power supply terminal 1-3a of the differential amplifier 1-3 to each other.

As a desired state, a state in which a power supply voltage supplied to the differential amplifier 2 is set highest and a supplied power supply voltage increases from the differential amplifier 1-1 to the differential amplifier 1-3 is implemented. That is, a state in which voltages supplied between the positive-side power supply terminals and negative-side power supply terminals of the differential amplifiers 1-1 to 1-3 increase in the order from the differential amplifier 1-1 to the differential amplifier 1-3 is implemented. In this example, $V_{M2}-V_3>V_{M1}$ $V_{M2}>V_2-V_{M1}$ is set. This setting is implemented by the design of the differential amplifiers 1-1 to 1-3 and 2, as will be described later.

In this driver circuit 102, the differential amplifier 1-1 amplifies an input signal $V_{in}$, and sends the amplified input signal to the differential amplifier 1-2. The differential amplifier 1-2 further amplifies the amplified signal received from the differential amplifier 1-1, and sends the further amplified signal to the differential amplifier 1-3. The differential amplifier 1-3 further amplifies the amplified signal received from the differential amplifier 1-2, and sends yet further amplified signal to a differential amplifier 2. The differential amplifier 2 further amplifies the amplified signal received from the differential amplifier 1-3, and outputs yet further amplified signal as an output signal $V_{out}$.

As compared to the driver circuit 100 according to the first embodiment, the driver circuit 102 according to the fourth embodiment is an example of an arrangement that can increase the number of stages of the amplifiers as a whole without increasing power consumption, and is thus suitable to widen the band and perform a high-gain operation. As compared to a case in which each of the differential amplifier 1-1 to 1-3 is driven by the power supply voltage $V_2$, the reduction of the power consumption by $2V_2 \times I_1$ can be expected, and it is capable of obtaining even greater reduction of the power consumption than that of the driver circuit 100 of the first embodiment while implementing a single power supply.

Figure 7:
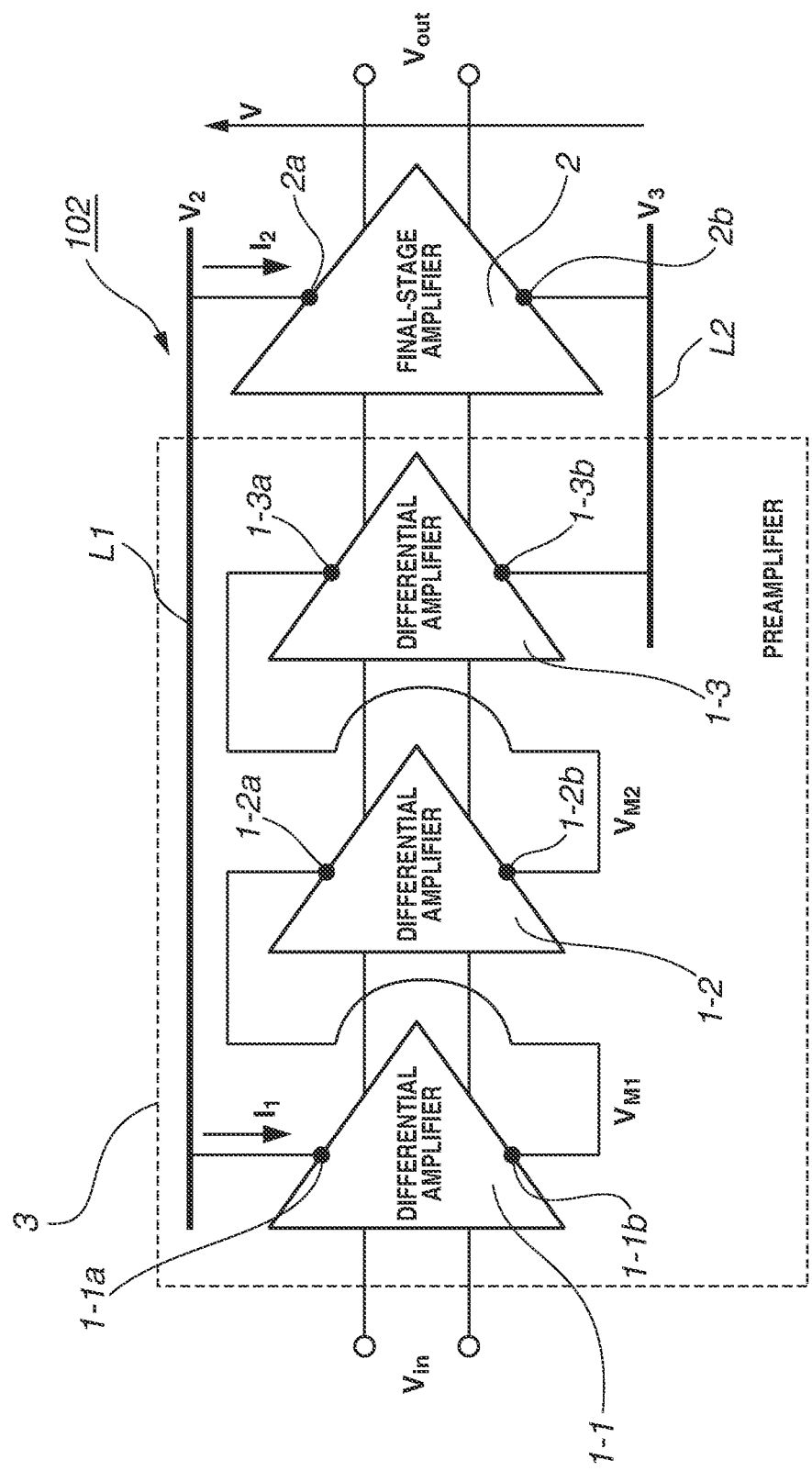
FIG. 7 is a circuit diagram showing the main part of a driver circuit according to the fourth embodiment of the present invention.

Note that the driver circuit 100 shown in FIG. 1 includes the two-stage preamplifier 3, and the driver circuit 102 shown in FIG. 7 includes the three-stage preamplifier 3. However, the preamplifier 3 is not limited to a multistage differential amplifier such as a two- or three-stage differential amplifier. As indicated by a driver circuit 103 in FIG. 8, it is apparently possible to extend the arrangement to an arrangement in which differential amplifiers 1-1 to 1-N (N is an integer of 4 or more) are cascade-connected.

Figure 8:
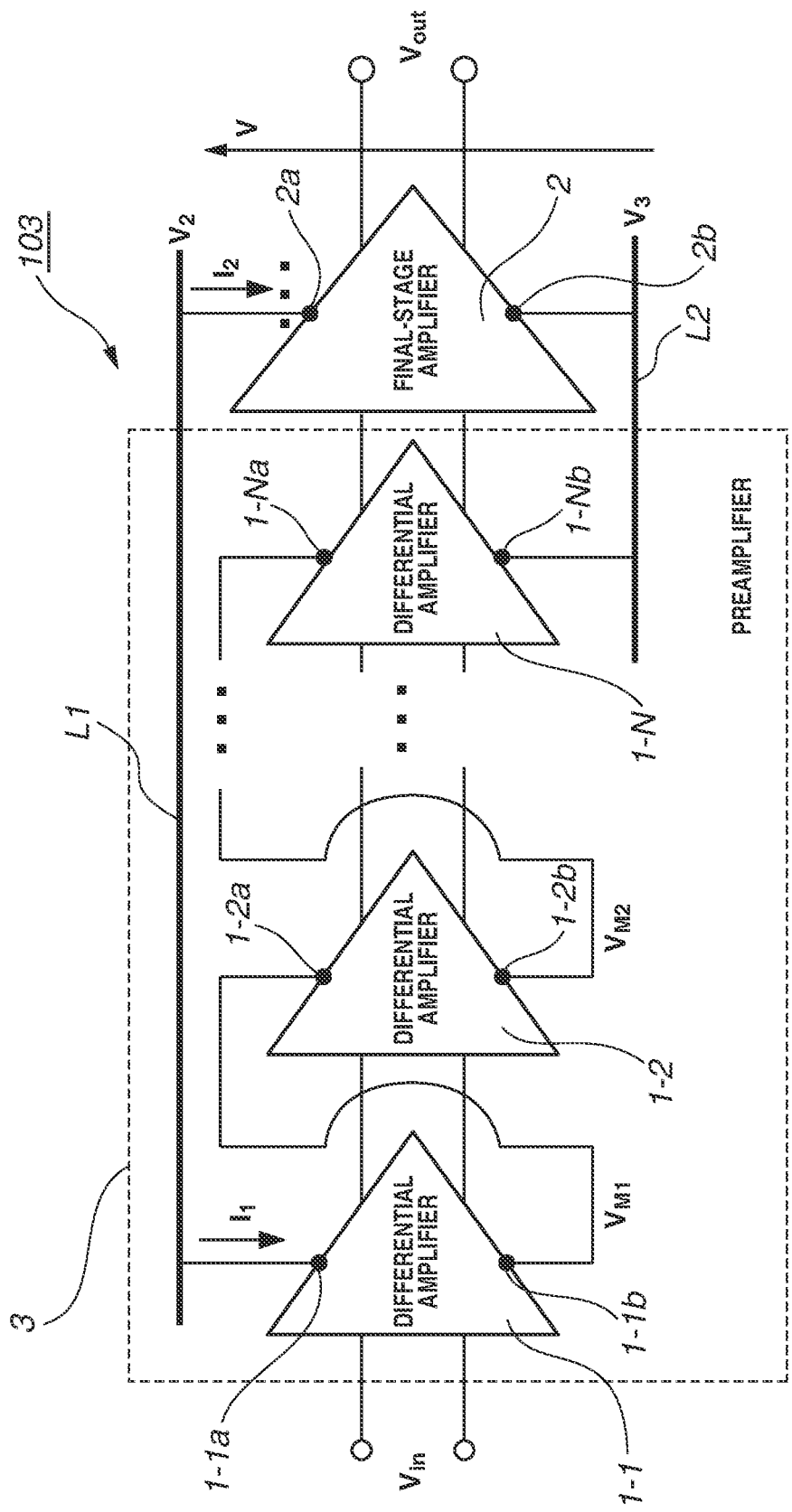
FIG. 8 is a circuit diagram showing an example in which an N-stage (N is an integer of 4 or more) preamplifier is provided in the driver circuit of the first embodiment.

In the driver circuit 103 shown in FIG. 8, the differential amplifiers 1-1 to 1-N are connected in series between a positive-side power supply line L1 and a negative-side power supply line L2 by connecting a positive-side power supply terminal 1-1a of the differential amplifier 1-1 to the positive-side power supply line L1, connecting a negative-side power supply terminal 1-Nb of the differential amplifier 1-N to the negative-side power supply line L2, and connecting the negative-side power supply terminals and positive-side power supply terminals of the differential amplifiers between the differential amplifiers 1-1 and 1-N. As a desired state, a state in which a power supply voltage supplied to a differential amplifier 2 is set highest and a supplied power supply voltage increases from the differential amplifier 1-1 to the differential amplifier 1-N is implemented.

Figure 4:
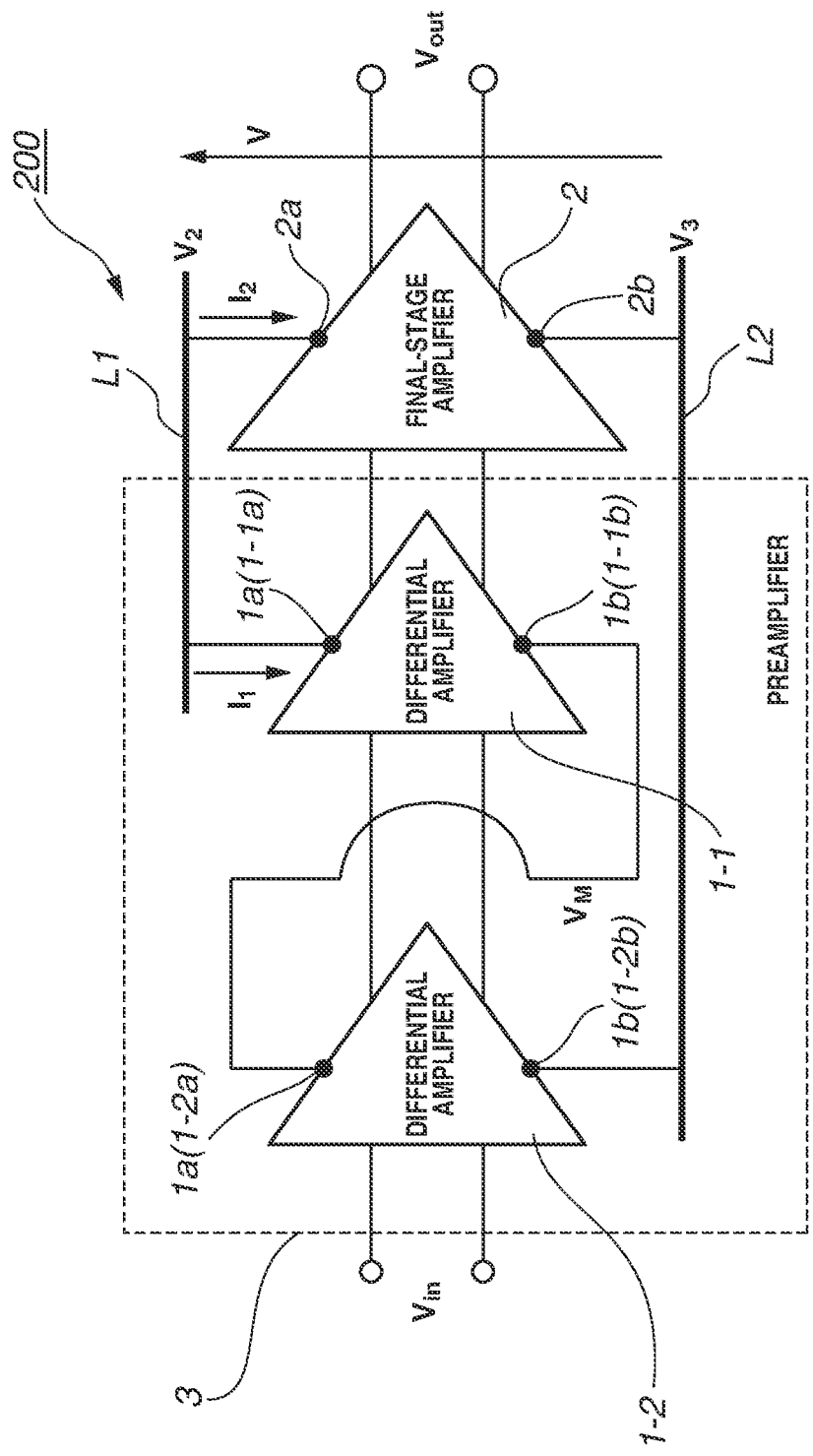
FIG. 4 is a circuit diagram showing the main part of a driver circuit according to the second embodiment of the present invention.
Figure 9:
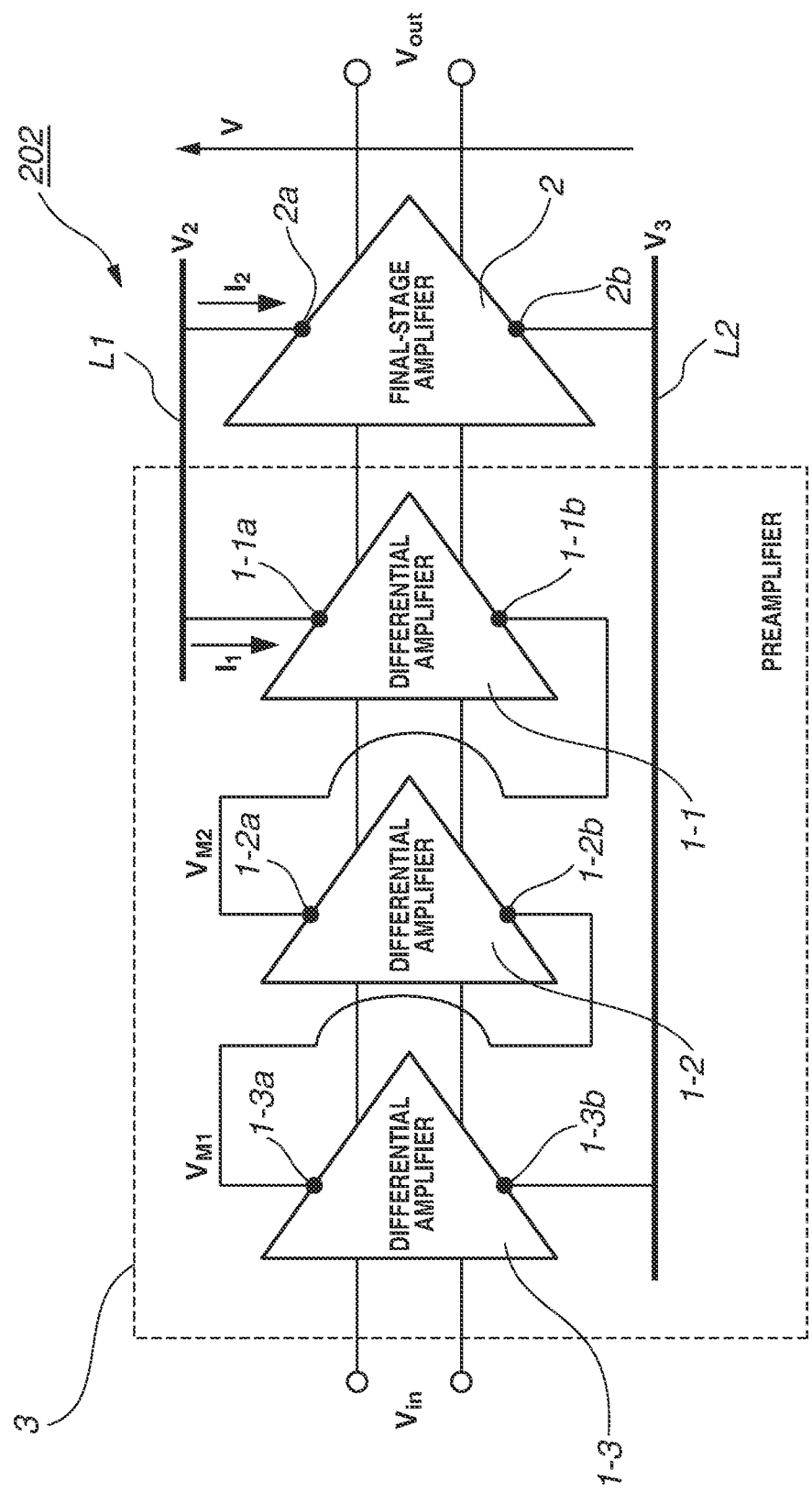
FIG. 9 is a circuit diagram showing an example in which a three-stage preamplifier is provided in the driver circuit of the second embodiment.
Figure 10:
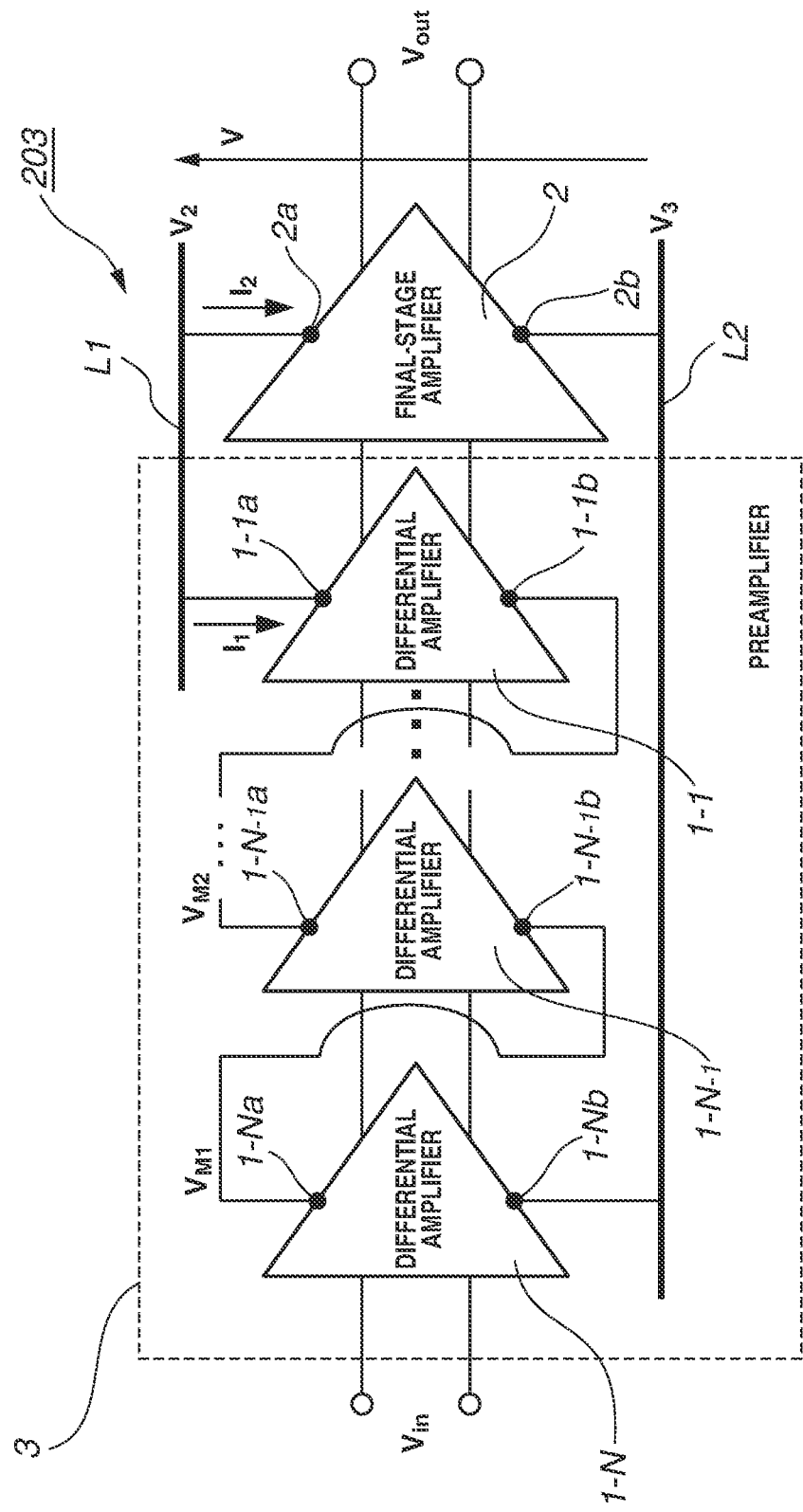
FIG. 10 is a circuit diagram showing an example in which an N-stage (N is an integer of 4 or greater) preamplifier is provided in the driver circuit of the second embodiment.

As for the driver circuit 200 shown in FIG. 4 as well, a three-stage preamplifier 3 may be provided, as indicated by a driver circuit 202 in FIG. 9. It is also possible to extend the arrangement to an arrangement in which differential amplifiers 1-1 to 1-N(N is an integer of 4 or more) are cascade-connected, as indicated by a driver circuit 203 in FIG. 10. The arrangements shown in FIGS. 9 and 10 are examples of the second connection form.

Fifth Embodiment

Figure 11:
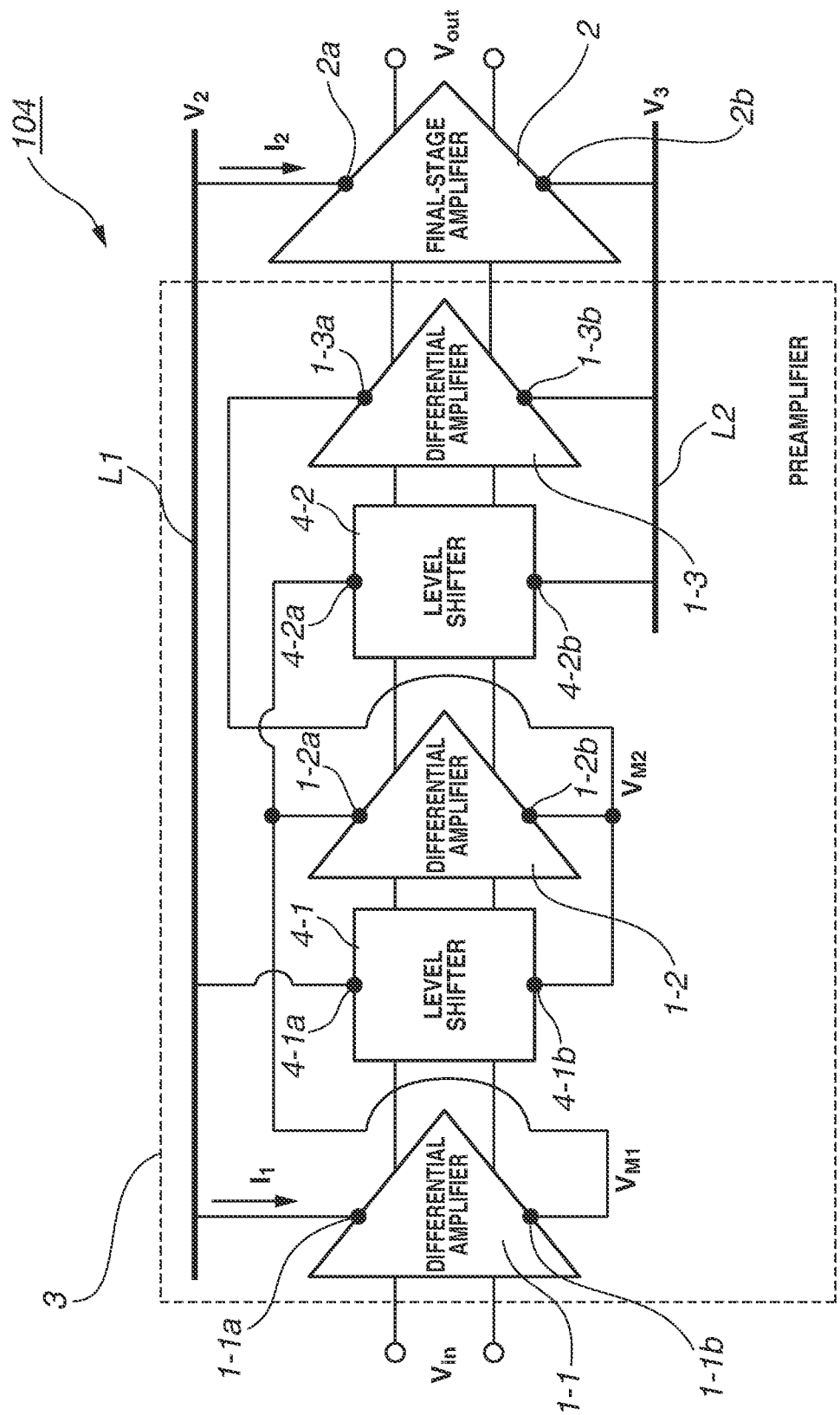
FIG. 11 is a circuit diagram showing the main part of a driver circuit according to the fifth embodiment of the present invention.

FIG. 11 shows, as a driver circuit 104 according to fifth embodiment, an example in which level shifters 4 are provided in the driver circuit 102 (FIG. 7) of the fourth embodiment. In this driver circuit 104, a level shifter 4-1 is provided on the input/output path of a signal between differential amplifiers 1-1 and 1-2 and a level shifter 4-2 is provided on the input/output path of the signal between the differential amplifier 1-2 and a differential amplifier 1-3. The fifth embodiment will describe an example of the first connection form.

In this driver circuit 104, a positive-side power supply terminal 4-1a of the level shifter 4-1 is connected to a positive-side power supply terminal 1-1a (positive-side power supply line L1) of the immediately precedingly connected differential amplifier 1-1, and a negative-side power supply terminal 4-1*b* of the level shifter 4-1 is connected to a negative-side power supply terminal 1-2*b* of the immediately succeedingly connected differential amplifier 1-2.

Furthermore, a positive-side power supply terminal 4-2*a* of the level shifter 4-2 is connected to a positive-side power supply terminal 1-2*a* of the immediately precedingly connected differential amplifier 1-2, and a negative-side power supply terminal 4-2*b* of the level shifter 4-2 is connected to a negative-side power supply terminal 1-3*b* (negative-side power supply line L2) of the immediately succeedingly connected differential amplifier 1-3.

It is possible to implement an arrangement in which a current flowing into the level shifter 4 flows into another differential amplifier 1, by commonly connecting the positive-side power supply of the level shifter 4 and that of the preceding-stage differential amplifier 1 to which the level shifter 4 is connected and commonly connecting the negative-side power supply of the level shifter 4 and that of the succeeding-stage differential amplifier 1 to which the level shifter 4 is connected, thereby achieving greater reduction in power consumption.

Figure 12:
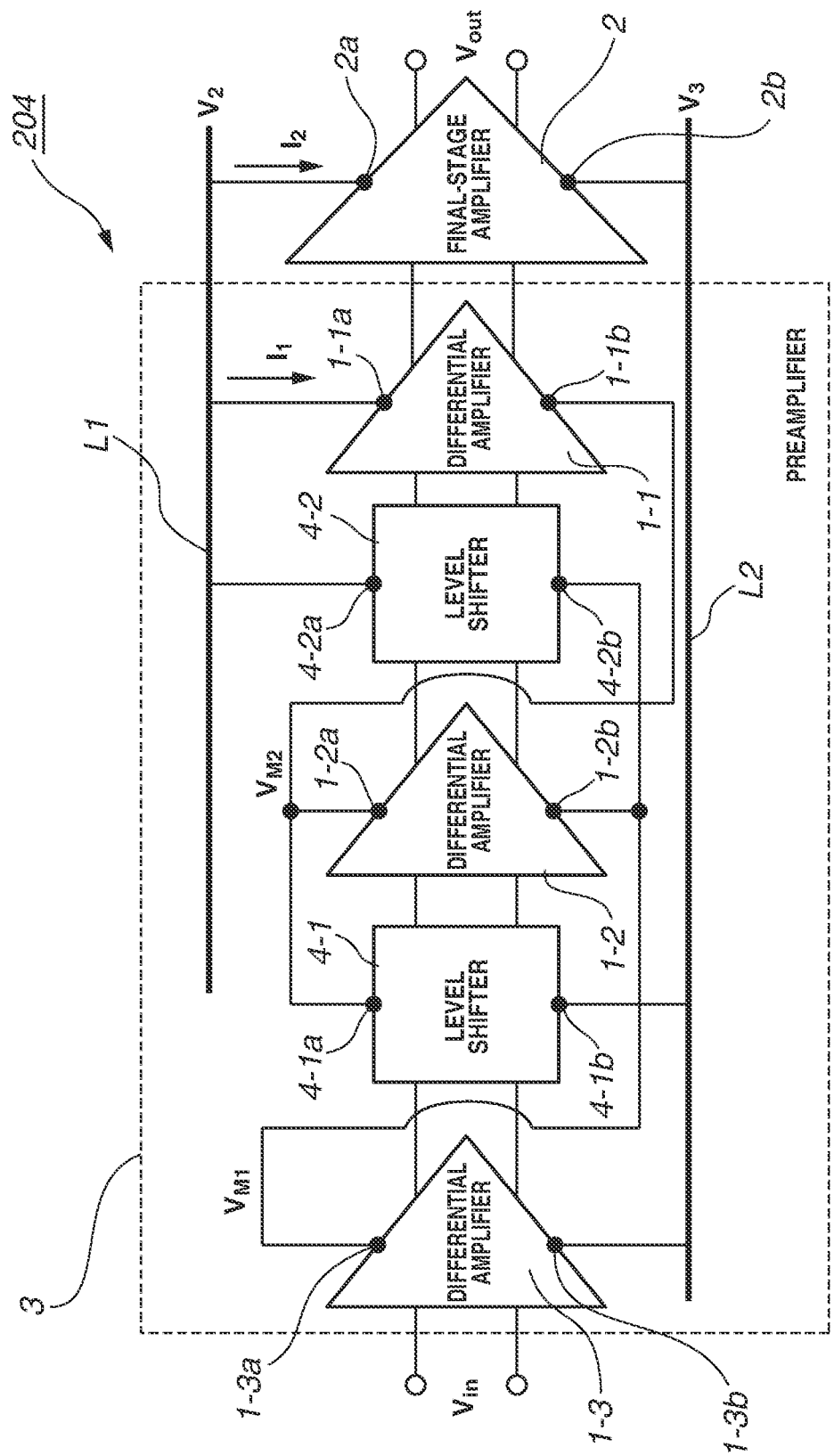
FIG. 12 is a circuit diagram showing an example in which the driver circuit shown in FIG. 9 is provided with level shifters.

Note that FIG. 11 shows an example in which the level shifters 4 are provided in the driver circuit 102 shown in FIG. 7. However, as indicated by a driver circuit 204 in FIG. 12, the level shifters 4 may be provided in the driver circuit 202 shown in FIG. 9.

In this driver circuit 204, a differential amplifier 1-3 is set as a first-stage amplifier, a differential amplifier 1-2 is set as a second-stage amplifier, a differential amplifier 1-1 is set as a third-stage amplifier, a level shifter 4-1 is provided on the input/output path of a signal between the differential amplifiers 1-2 and 1-3, and a level shifter 4-2 is provided on the input/output path of the signal between the differential amplifiers 1-2 and 1-1.

Furthermore, in this driver circuit 204, a positive-side power supply terminal 4-1*a* of the level shifter 4-1 is connected to a positive-side power supply terminal 1-2*a* of the immediately succeedingly connected differential amplifier 1-2, and a negative-side power supply terminal 4-1*b* of the level shifter 4-1 is connected to a negative-side power supply terminal 1-3*b* (a negative-side power supply line L2) of the immediately precedingly connected differential amplifier 1-3. In addition, a positive-side power supply terminal 4-2*a* of the level shifter 4-2 is connected to a positive-side power supply terminal 1-1*a* (a positive-side power supply line L1) of the immediately succeedingly connected differential amplifier 1-1, and a negative-side power supply terminal 4-2*b* of the level shifter 4-2 is connected to a negative-side power supply terminal 1-2*b* of the immediately precedingly connected differential amplifier 1-2.

Sixth Embodiment

Figure 13:
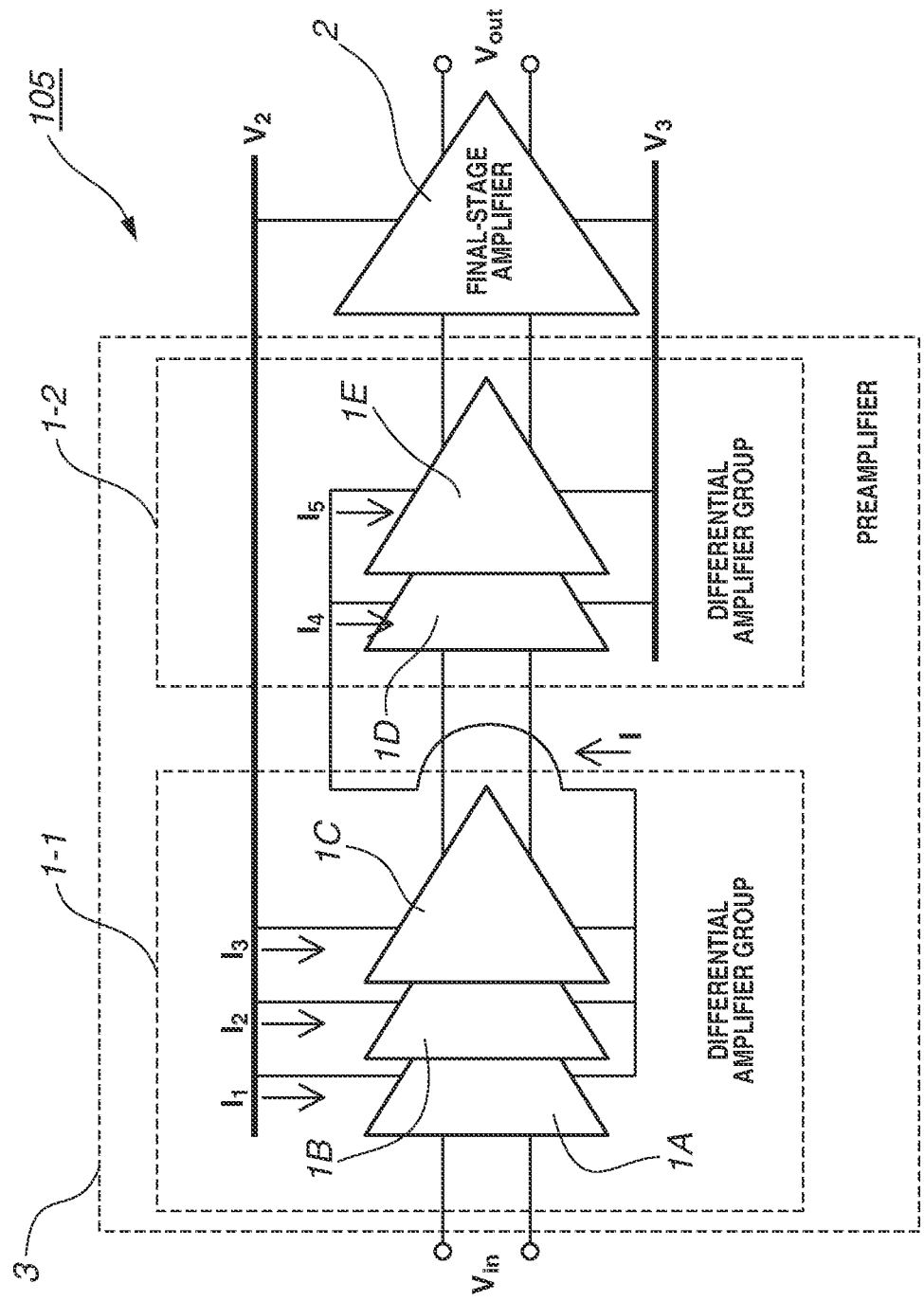
FIG. 13 is a circuit diagram showing the main part of a driver circuit according to the sixth embodiment of the present invention.

In the driver circuit 100 according to the first embodiment, the differential amplifiers 1-1 and 1-2 are single-stage differential amplifiers. However, a differential amplifier group constituted by a plurality of cascade-connected differential amplifiers may be used. FIG. 13 shows an example in which differential amplifiers 1-1 and 1-2 are each formed from a differential amplifier group.

In a driver circuit 105, a differential amplifier group of three stages including differential amplifiers 1A, 1B, and 1C is adopted as the differential amplifier 1-1, and a differential amplifier group of two stages including differential amplifiers 1D and 1E is adopted as the differential amplifier 1-2.

Generally, in many cases, in a driver circuit, a later-stage amplifier processes a signal having a larger amplitude, and not only a power supply voltage but also necessary current consumption is larger in a later-stage amplifier. In the driver circuit 105 according to the sixth embodiment, a current consumed by an amplifier of each stage can be increased by making the number of stages of the amplifiers forming the differential amplifier 1-2 smaller than that of the amplifiers forming the differential amplifier 1-1.

In FIG. 13, $I_1+I_2+I_3=I_4+I_5=I$ holds. However, for example, assuming that $I_1=I_2=I_3=I/3$ and $I_4=I_5=I/2$ are set, a large current can be set for each of the amplifiers forming the succeeding-stage differential amplifier 1-2, as compared to each of the amplifiers forming the differential amplifier 1-1.

Assuming that $I_1<I_2<I_3<I_4<I_5$ is set, an arrangement in which a current in each of the amplifiers forming the differential amplifiers 1-1 and 1-2 gradually increases toward a later stage can be implemented. That is, when, as currents flowing into the amplifiers forming the differential amplifiers 1-1 and 1-2, $I_F$ represents a current flowing into a preceding-stage amplifier and $I_B$ represents a current flowing into a succeeding-stage amplifier, $I_F<I_B$ is set, thereby implementing an arrangement in which a current gradually increases toward a later stage.

The arrangement according to the fifth embodiment can be combined with the third embodiment (the arrangement in which the level shifter is provided between the output terminal of the differential amplifier 1-1 and the input terminal of the differential amplifier 1-2) or the fourth embodiment (the arrangement in which the differential amplifiers 1-3, . . . , 1-N(N is an integer of 4 or more) are provided at the succeeding stage of the differential amplifier 1-2). Alternatively, the arrangement can be combined with the second embodiment (the arrangement in which the differential amplifier 1-2 is set as a first-stage amplifier and the differential amplifier 1-2 is set as a second-stage amplifier).

Note that in the driver circuit 105 shown in FIG. 13, the example of forming each of the differential amplifiers 1-1 and 1-2 by a multistage amplifier is shown. However, an example in which only the differential amplifier 1-1 is formed by a multistage amplifier is also applicable. Furthermore, the differential amplifier 1-1 is implemented by a differential amplifier group of three stages, and the differential amplifier 1-2 is implemented by a differential amplifier group of two stages. That is, the number of stages of the amplifiers forming the preceding-stage amplifier group is greater than that of the amplifiers forming the succeeding-stage amplifier group. However, the number of stages of the amplifiers forming the preceding-stage amplifier group may be equal to that of the amplifiers forming the succeeding-stage amplifier group.

Furthermore, as for each of the driver circuits shown in FIGS. 1 and 4 to 10 described above, an example of a circuit in which currents of the same value flow into all the differential amplifiers 1 connected in series has been explained. However, the driver circuit 101 shown in FIG. 1 may have an arrangement in which a circuit serving as a current path is provided between the $V_2$ terminal and the $V_M$ terminal or between the $V_M$ terminal and the $V_3$ terminal and a current flowing into the differential amplifier 1-1≠a current flowing into the differential amplifier 1-2 is set.

According to the present invention, the number of stages of the amplifiers forming the final-stage amplifier is not limited. In all the embodiments, the differential amplifier 2 may be implemented by an amplifier group formed from a plurality of amplifiers.

Seventh Embodiment

The seventh embodiment has a feature that an amplifier in which a constant current flows into differential amplifiers 1 (1-1 to 1-N) and a differential amplifier 2 is used. More specifically, the seventh embodiment has a feature that a tail current source formed by a transistor having a gate terminal connected to a fixed potential and a source terminal connected to a VM terminal is provided in the differential amplifier 1 or 2.

In general, a power supply terminal desirably has low impedance since a voltage noise generated in the power supply terminal can be reduced. For example, when, as shown in FIG. 1, a power supply voltage is supplied from the differential amplifier 1-1 to the differential amplifier 1-2, it is difficult to decrease the impedance of the power supply terminal that is not directly connected to the positive-side power supply line L1 and that of the power supply terminal (the positive-side power supply terminal 1-2a and negative-side power supply terminal 1-1b in FIG. 1) that is not directly connected to the negative-side power supply line L2, posing a problem that large voltage noise is generated when a current flowing into these power supply terminals changes.

To solve this problem, by using the amplifier in which a constant current flows into the differential amplifiers 1 and 2, a current flowing into a power supply terminal that is not directly connected to a positive-side power supply line L1 and a power supply terminal that is not directly connected to a negative-side power supply line L2 is kept constant, thereby suppressing generation of voltage noise.

Figure 14:
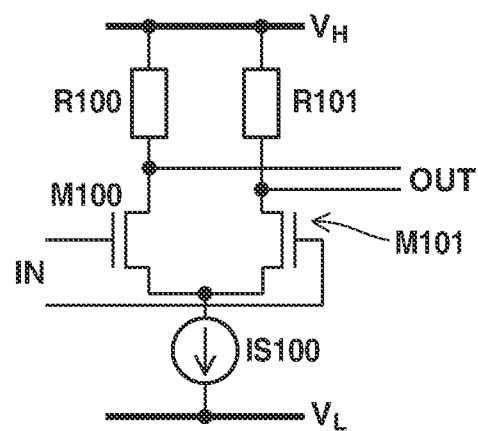
FIG. 14 is a circuit diagram showing an example of the arrangement of a differential amplifier.
Figure 15:
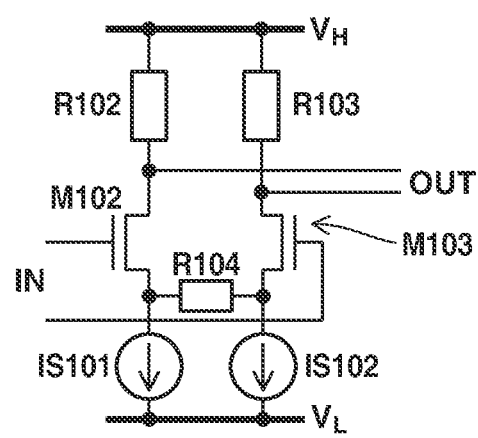
FIG. 15 is a circuit diagram showing another example of the arrangement of the differential amplifier.

FIGS. 14 and 15 each show an example of the arrangement of a differential amplifier into which a constant current flows. The differential amplifier shown in FIG. 14 is formed from a transistor M100 having a gate connected to the non-inverting input terminal of the differential amplifier and a drain connected to the inverting output terminal of the differential amplifier, a transistor M101 having a gate connected to the inverting input terminal of the differential amplifier and a drain connected to the non-inverting output terminal of the differential amplifier, a resistor R100 having one terminal connected to a positive-side power supply terminal $V_H$ and the other terminal connected to the inverting output terminal of the differential amplifier, a resistor R101 having one terminal connected to the positive-side power supply terminal $V_H$ and the other terminal connected to the non-inverting output terminal of the differential amplifier, and a current source circuit IS100 having one terminal connected to the sources of the transistors M100 and M101 and the other terminal connected to a negative-side power supply terminal $V_L$.

The differential amplifier shown in FIG. 15 is formed from a transistor M102 having a gate connected to the non-inverting input terminal of the differential amplifier and a drain connected to the inverting output terminal of the differential amplifier, a transistor M103 having a gate connected to the inverting input terminal of the differential amplifier and a drain connected to the non-inverting output terminal of the differential amplifier, a resistor R102 having one terminal connected to the positive-side power supply terminal $V_H$ and the other terminal connected to the inverting output terminal of the differential amplifier, a resistor R103 having one terminal connected to the positive-side power supply terminal $V_H$ and a non-inverting output terminal of the differential amplifier, a resistor R104 having one terminal connected to the source of the transistor M102 and the other terminal connected to the source of the transistor M103, a current source circuit IS101 having one terminal connected to the source of the transistor M102 and the other terminal connected to the negative-side power supply terminal $V_L$, and a current source circuit IS102 having one terminal connected to the source of the driver circuit 103 and the other terminal connected to the negative-side power supply terminal $V_L$. When I represents a current flowing into the current source circuit IS100, a current flowing into each of the current source circuits IS101 and IS102 is represented by I/2.

In each of the arrangements shown in FIGS. 14 and 15, the current source circuit IS100, IS101, or IS102 causes a constant current to flow from the positive-side power supply terminal $V_H$ to the negative-side power supply terminal $V_L$ all the time. Thus, even if the positive-side power supply terminal $V_H$ is not directly connected to the positive-side power supply line L1, voltage noise generated in the positive-side power supply terminal $V_H$ can be set to zero. Similarly, even if the negative-side power supply terminal $V_L$ is not directly connected to the negative-side power supply line L2, voltage noise generated in the negative-side power supply terminal $V_L$ can be set to zero.

On the other hand, in reality, an ideal current source circuit cannot be implemented. Therefore, when a signal is input to the input terminal of the differential amplifier, a current flowing into the differential amplifier slightly changes. To cope with this situation, the current source circuit directly connected to the negative-side power supply terminal $V_L$ is formed by a transistor having a gate connected to a fixed potential and a source connected to the negative-side power supply terminal $V_L$. Since the source terminal of a gate-grounded transistor has low impedance, it is possible to suppress the voltage noise generated when a current flowing into the negative-side power supply terminal $V_L$ slightly changes.

Figure 16:
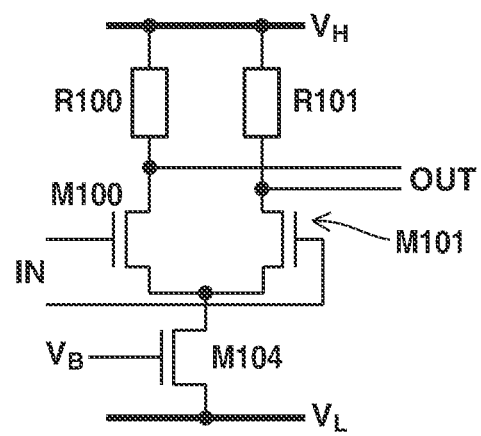
FIG. 16 is a circuit diagram showing an example of the arrangement of a differential amplifier of a driver circuit according to the seventh embodiment of the present invention.
Figure 17:
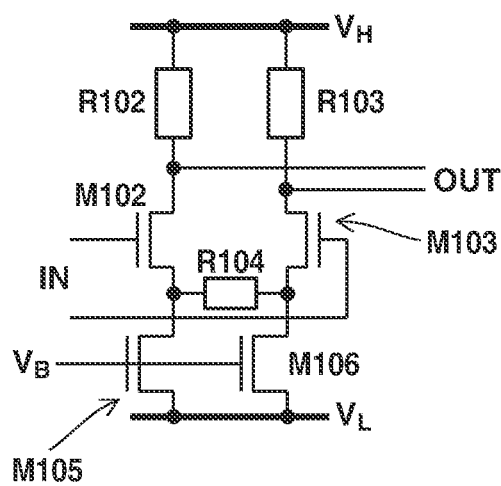
FIG. 17 is a circuit diagram showing another example of the arrangement of the differential amplifier of the driver circuit according to the seventh embodiment of the present invention.

FIGS. 16 and 17 respectively show arrangements in which transistors are used as the current source circuits IS100, IS101, and IS102 of the differential amplifiers shown in FIGS. 14 and 15. A differential amplifier shown in FIG. 16 uses, as the current source circuit IS100 of the differential amplifier shown in FIG. 14, a transistor M104 having a gate to which a fixed voltage $V_B$ is input, a drain connected to the sources of the transistors M100 and M101, and a source connected to the negative-side power supply terminal $V_L$.

A differential amplifier shown in FIG. 17 uses, as the current source circuit IS101 of the differential amplifier shown in FIG. 15, a transistor M105 having a gate to which the fixed voltage $V_B$ is input, a drain connected to the source of the transistor M102, and a source connected to the negative-side power supply terminal $V_L$. In addition, a transistor M106 having a gate to which the fixed voltage $V_B$ is input, a drain connected to the source of the transistor M103, and a source connected to the negative-side power supply terminal $V_L$ is used as the current source circuit IS102.

When the arrangement shown in FIG. 16 or 17 is used as each of the differential amplifiers 1 (1-1 to 1-N) and 2 described in each of the first to sixth embodiments, the positive-side power supply terminal $V_H$ is connected to the positive-side power supply line L1 or the negative-side power supply terminal of another differential amplifier. Furthermore, the negative-side power supply terminal $V_L$ is connected to the negative-side power supply line L2 or the positive-side power supply terminal of another differential amplifier.

When the arrangement shown in FIG. 16 or 17 is used as each of the differential amplifiers 1 (1-1 to 1-N) and 2, it is possible to implement an arrangement in which the source terminal of each of the transistors M104, M105, and M106 is connected to the negative-side power supply terminal $V_L$, thereby decreasing the impedance of the negative-side power supply terminal $V_L$. Since the potential of the negative-side power supply terminal $V_L$ is lower than the fixed voltage $V_B$ by a gate-source voltage of each of the transistors M104, M105, and M106, the potential of the negative-side power supply terminal $V_L$ can be set to a desired potential by the fixed voltage $V_B$.

Furthermore, when the arrangement shown in FIG. 16 or 17 is used as each of the differential amplifiers 1 (1-1 to 1-N) and 2, a state in which a higher power supply voltage is supplied to a later-stage amplifier can be easily implemented by designing the circuit.

Note that in the seventh embodiment, an FET (Field Effect Transistor) is used as a transistor forming a differential amplifier. It is apparent that the same effect can be obtained even if a bipolar transistor is used.

Eighth Embodiment

The eighth embodiment will describe an example of the arrangement of a level shifter 4 (4-1 or 4-2). More specifically, the eighth embodiment has a feature that the level shifter 4 is a circuit (for example, source-follower circuit) for allowing to shift an operating point from a DC signal component.

In optical communication, a circuit capable of transmitting a low-frequency signal is desirable. However, in a general circuit example, a capacitive element is inserted into a signal path, and it is thus difficult to apply the circuit to optical communication.

Figure 18:
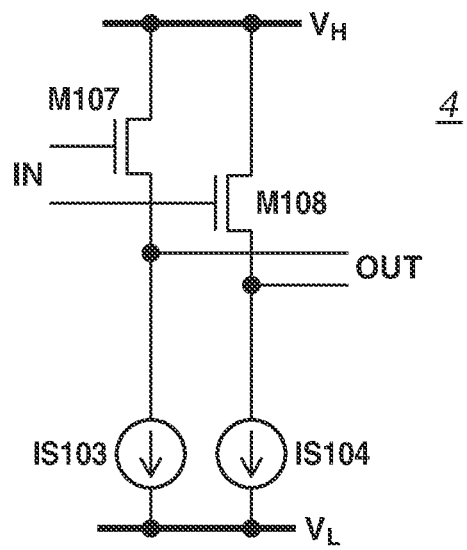
FIG. 18 is a circuit diagram showing an example of the arrangement of a level shifter of a driver circuit according to the eighth embodiment of the present invention.

In the eighth embodiment, the source follower level shifter 4 shown in FIG. 18 is used. This allows an operating point to shift from a DC signal component, thereby applying the level shifter 4 to optical communication. The level shifter 4 shown in FIG. 18 is formed from a transistor M107 having a gate connected to the non-inverting input terminal of the level shifter 4, a drain connected to a positive-side power supply terminal $V_H$, and a source connected to the non-inverting output terminal of the level shifter 4, a transistor M108 having a gate connected to the inverting input terminal of the level shifter 4, a drain connected to the positive-side power supply terminal $V_H$, and a source connected to the inverting output terminal of the level shifter 4, a current source circuit IS103 having one terminal connected to the non-inverting output terminal of the level shifter 4 and the other terminal connected to a negative-side power supply terminal $V_L$, and a current source circuit IS104 having one terminal connected to the inverting output terminal of the level shifter 4 and the other terminal connected to the negative-side power supply terminal $V_L$.

Figure 19:
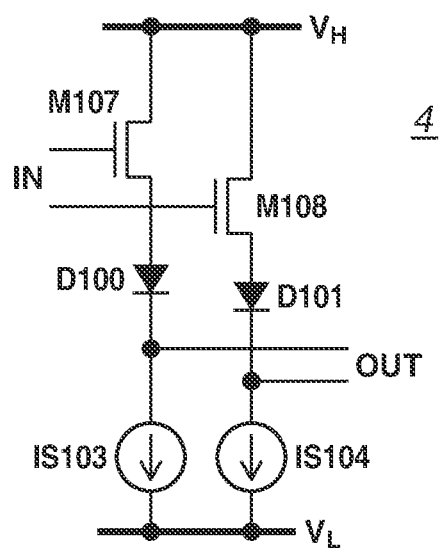
FIG. 19 is a circuit diagram showing another example of the arrangement of the level shifter of the driver circuit according to the eighth embodiment of the present invention.

A greater shift in the operating point from the DC signal component is allowed by inserting diodes D100 and D101 between the output terminal of the level shifter 4 and the sources of the transistors M107 and M108 in FIG. 18, as shown in FIG. 19.

In the present invention, the level shifter 4 obtains a greater shift in the operating point, equivalent to a power supply voltage, necessary to drive the differential amplifier 1 or 2. Not only the operating point is shifted by the source-follower but also the operating point is further shifted by the diodes D100 and D101, thereby allowing a greater shift in the operating point. Note that instead of the diodes D100 and D101, diode-connected transistors (transistors each having a gate and drain connected to each other) may be used.

Figure 20:
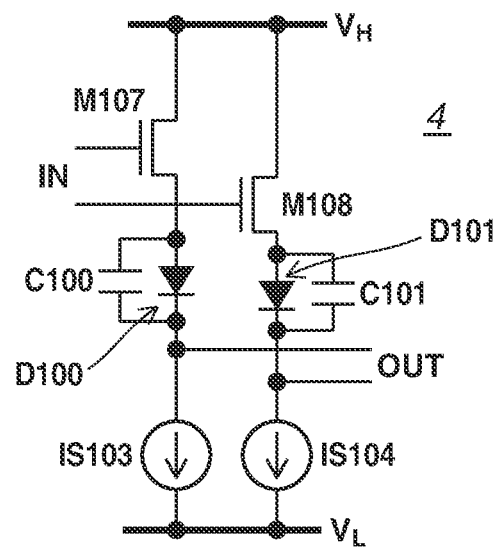
FIG. 20 is a circuit diagram showing still another example of the arrangement of the level shifter of the driver circuit according to the eighth embodiment of the present invention.

As shown in FIG. 20, capacitive elements C100 and C101 may be provided in parallel to the diodes D100 and D101 of the level shifter 4 shown in FIG. 19. As described above, while insertion of the diodes D100 and D101 allows a greater shift in the operating point, the band of the level shifter 4 is limited by a loss of high-frequency signals of the diodes D100 and D101. In the arrangement shown in FIG. 20, the high-frequency signals pass through the capacitive elements C100 and C101 by adding the capacitive elements C100 and C101, thereby implementing the level shifter 4 operable for the high-frequency signals.

Note that when the arrangement shown in each of FIGS. 18 to 20 is used as the level shifter 4 (4-1 or 4-2), the positive-side power supply terminal $V_H$ is connected to the positive-side power supply line L1 or the positive-side power supply terminal of another differential amplifier. The negative-side power supply terminal $V_L$ is connected to the negative-side power supply line L2 or the negative-side power supply terminal of another differential amplifier.

In the eighth embodiment, an FET is used as a transistor forming the level shifter 4. However, it is apparent that the same effect can be obtained even if a bipolar transistor is used.

Ninth Embodiment

Figure 21:
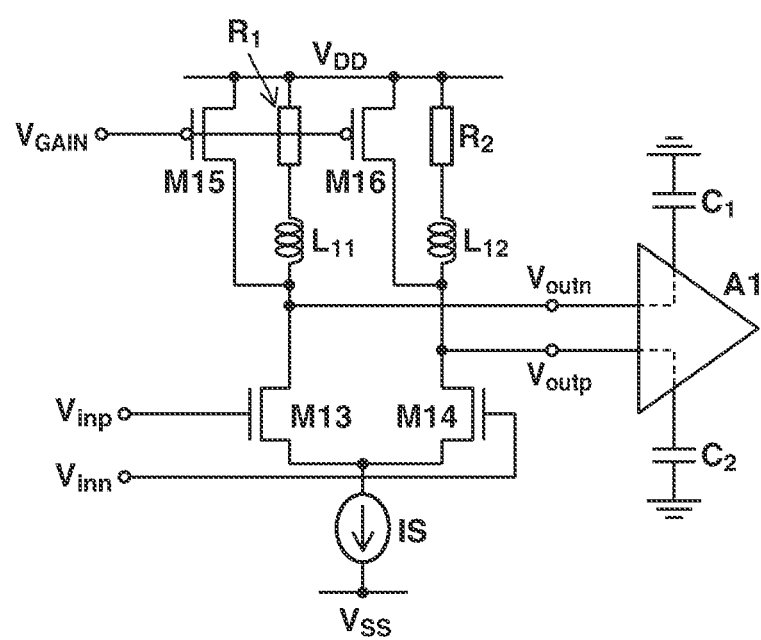
FIG. 21 is a circuit diagram showing the arrangement of a variable gain amplifier according to the ninth embodiment of the present invention.

The ninth embodiment will describe an example in which a variable gain amplifier is used as at least one of the plurality of differential amplifiers 1 (1-1 to 1-N) described in each of the first to sixth embodiments. FIG. 21 is a circuit diagram showing the arrangement of a variable gain amplifier according to the ninth embodiment of the present invention. The variable gain amplifier is formed from an n-type MOS transistor M13 having a gate connected to a non-inverting input terminal ($V_{inp}$) of the variable gain amplifier and a drain connected to an inverting output terminal ($V_{outn}$) of the variable gain amplifier, an n-type MOS transistor M14 having a gate connected to an inverting input terminal ($V_{inn}$) of the variable gain amplifier and a drain connected to a non-inverting output terminal ($V_{outp}$) of the variable gain amplifier, a p-type MOS transistor M15 having a gate to which a gain control voltage $V_{GAIN}$ is input, a source connected to a positive-side power supply voltage $V_{DD}$, and a drain connected to an inverting output terminal ($V_{outn}$) a p-type MOS transistor M16 having a gate to which the gain control voltage $V_{GAIN}$ is input, a source connected to the positive-side power supply voltage $V_{DD}$, and a drain connected to the non-inverting output terminal ($V_{outp}$), a resistor $R_1$ and inductor $L_{11}$ inserted in series between the positive-side power supply voltage $V_{DD}$ and the inverting output terminal ($V_{outn}$), a resistor $R_2$ and inductor $L_{12}$ inserted in series between the positive-side power supply voltage $V_{DD}$ and the non-inverting output terminal $V_{outp}$, and a current source circuit is connected between the sources of the n-type MOS transistor M13 and M14 and a negative-side power supply voltage $V_{SS}$.

In the ninth embodiment, the transistors M15 and M16 whose gates receive the gain control voltage $V_{GAIN}$ implement a variable resistor.

$V_{inp}$ represents a non-inverting input voltage signal, $V_{inn}$ represents an inverting input voltage signal, $V_{outp}$ represents a non-inverting output voltage signal, $V_{outn}$ represents an inverting output voltage signal, and A1 represents a next-stage amplifier.

Figure 22:
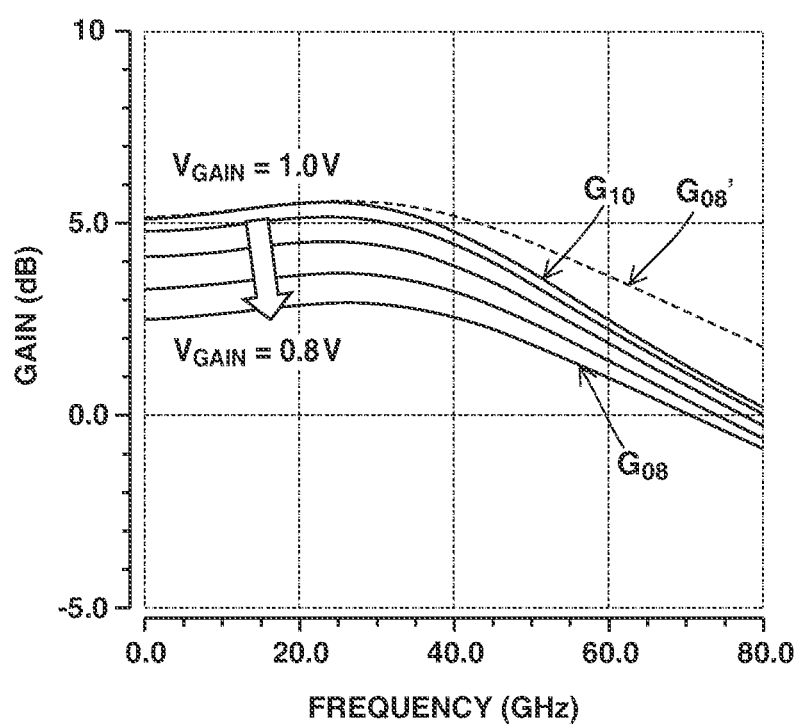
FIG. 22 is a graph showing the gain-frequency characteristic of the variable gain amplifier according to the ninth embodiment of the present invention.

FIG. 22 is a graph showing a result of simulating the gain-frequency characteristic of the variable gain amplifier when the gain control voltage $V_{GAIN}$ is changed from 0.8 V to 1.0 V in the circuit shown in FIG. 21 using 65 nm CMOS process parameters. In this simulation, the positive-side power supply voltage $V_{DD}$ is set to 1.5 V; the negative-side power supply voltage $V_{SS}$, 0 V; the value of each of the resistors $R_1$ and $R_2$, 70Ω; the value of each of the inductors $L_{11}$ and $L_{12}$, 250 pH; a size $W_p$ of each of the p-type MOS transistors M15 and M16, 28 µm; a size $W_n$ of each of the n-type MOS transistors M13 and M14, 48 µm; the current value of the current source circuit IS, 8 mA; and input capacitances $C_1$ and $C_2$ of the next-stage amplifier A1, 20 fF.

$G_{08}$ represents the gain-frequency characteristic for $V_{GAIN}$=0.8 V, $G_{10}$ represents the gain-frequency characteristic for $V_{GAIN}$=1.0 V, and $G_{08}$' represents a curve obtained by translating the gain-frequency characteristic for $V_{GAIN}$=0.8 V so that a DC gain coincides with that for $V_{GAIN}$=1.0 V. It can be confirmed that by using the arrangement according to the ninth embodiment, the gain can be controlled in a state in which the shape of the gain-frequency curve is maintained in a wider frequency range.

When comparing the gain-frequency curve $G_{10}$ for $V_{GAIN}$=1.0 V with the curve $G_{08}$' obtained by translating the gain-frequency curve $G_{08}$ for $V_{GAIN}$=0.8 V to make the DC gain coincide with that for $V_{GAIN}$=1.0 V, it is apparent that an ideal gain change in which the shape of the curve $G_{10}$ almost coincides with that of the curve $G_{08}$' in a wide frequency band of about 0 to 30 GHz can be implemented. It is also apparent from the simulation result of the ninth embodiment that the −3 dB bandwidth for $V_{GAIN}$=0.8 V is 75.7 GHz and the −3 dB bandwidth for $V_{GAIN}$=1.0 V is 62.8 GHz, and thus the change rate of the bandwidth is reduced to 20.5% to approach an ideal gain change.

10th Embodiment

Figure 23:
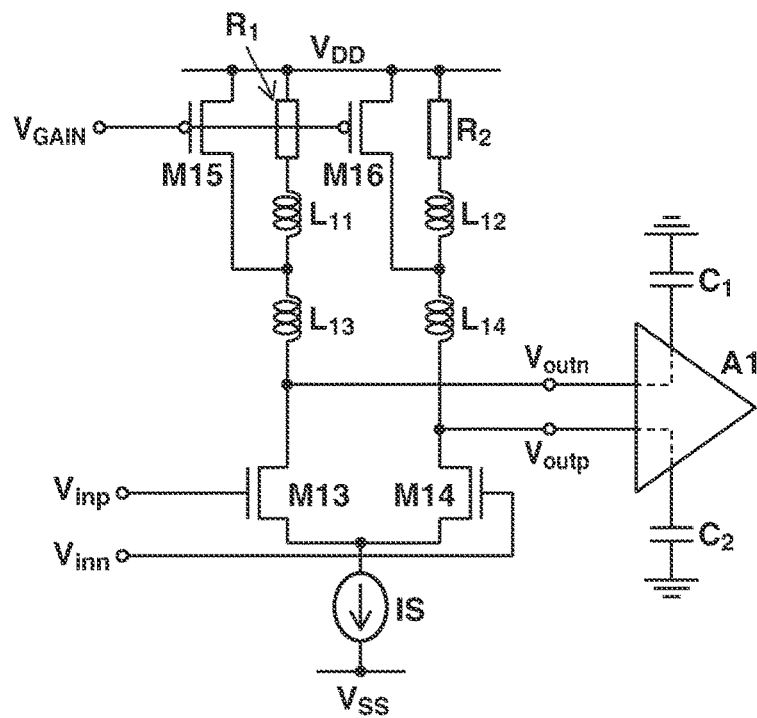
FIG. 23 is a circuit diagram showing the arrangement of a variable gain amplifier according to the 10th embodiment of the present invention.

The 10th embodiment will describe another example in which a variable gain amplifier is used as at least one of the plurality of differential amplifiers 1 (1-1 to 1-N) described in each of the first to sixth embodiments. FIG. 23 is a circuit diagram showing the arrangement of a variable gain amplifier according to the 10th embodiment of the present invention. The difference from the arrangement according to the ninth embodiment shown in FIG. 21 is that an inductor $L_n$ is provided between an inverting output terminal ($V_{outn}$) of the variable gain amplifier and a terminal, on the side of the inverting output terminal ($V_{outn}$), of a series circuit including a resistor $R_1$ and an inductor $L_{11}$ and a drain (a terminal, on the side of the inverting output terminal ($V_{outn}$), of the first variable resistor) of a p-type MOS transistor M15, and an inductor $L_{14}$ is provided between a non-inverting output terminal ($V_{outp}$) of the variable gain amplifier and a terminal, on the side of the non-inverting output terminal ($V_{outp}$), of a series circuit including a resistor $R_2$ and an inductor $L_{12}$ and a drain (a terminal, on the side of the non-inverting output terminal ($V_{outp}$), of the second variable resistor) of a p-type MOS transistor M16.

Figure 24:
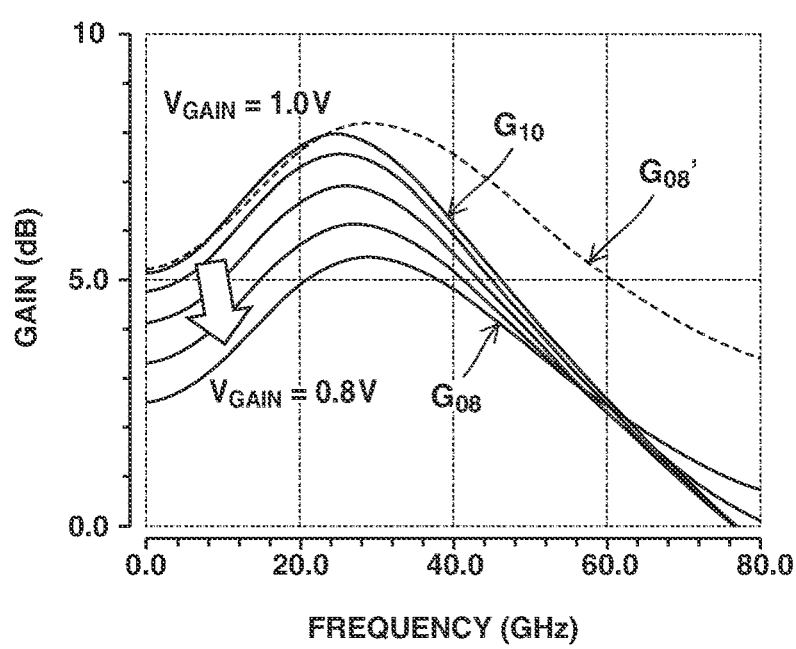
FIG. 24 is a graph showing the gain-frequency characteristic of the variable gain amplifier according to the 10th embodiment of the present invention.

FIG. 24 is a graph showing a result of simulating the gain-frequency characteristic of the variable gain amplifier when a gain control voltage $V_{GAIN}$ is changed from 0.8 V to 1.0 V in the circuit shown in FIG. 23 using 65 nm CMOS process parameters. In this simulation, a positive-side power supply voltage $V_{DD}$ is set to 1.5 V; a negative-side power supply voltage $V_{SS}$, 0 V; the value of each of the resistors $R_1$ and $R_2$, 70Ω; the value of each of the inductors $L_{11}$ and $L_{12}$, 400 pH; the value of each of the inductors $L_{13}$ and $L_{14}$, 100 pH; a size $W_p$ of each of the p-type MOS transistors M15 and M16, 28 µm; a size $W_n$ of each of the n-type MOS transistors M13 and M14, 48 µm; the current value of a current source circuit IS, 8 mA; and input capacitances $C_1$ and $C_2$ of a next-stage amplifier A1, 20 fF.

$G_{08}$ represents the gain-frequency characteristic for $V_{GAIN}$=0.8 V, $G_{10}$ represents the gain-frequency characteristic for $V_{GAIN}$=1.0 V, and $G_{08}$' represents a curve obtained by translating the gain-frequency characteristic for $V_{GAIN}$=0.8 V so that a DC gain coincides with that for $V_{GAIN}$=1.0 V.

It is apparent that by using the variable gain amplifier according to the 10th embodiment, the gain can be controlled in a state in which the shape of the gain-frequency curve is maintained in a wider frequency range while having the emphasis characteristic. An emphasis amount according to the 10th embodiment is 2.8 dB for $V_{GAIN}$=1.0 V and 2.9 dB for $V_{GAIN}$=0.8 V.

When comparing the gain-frequency curve $G_{10}$ for $V_{GAIN}$=1.0 V with the curve $G_{08}$' obtained by translating the gain-frequency curve $G_{08}$ for $V_{GAIN}$=0.8 V to make the DC gain coincide with that for $V_{GAIN}$=1.0 V, it is apparent that an ideal gain change in which the shape of the curve $G_{10}$ almost coincides with that of the curve $G_{08}$' in a wide frequency band of about 0 to 25 GHz can be implemented.

11th Embodiment

Figure 25:
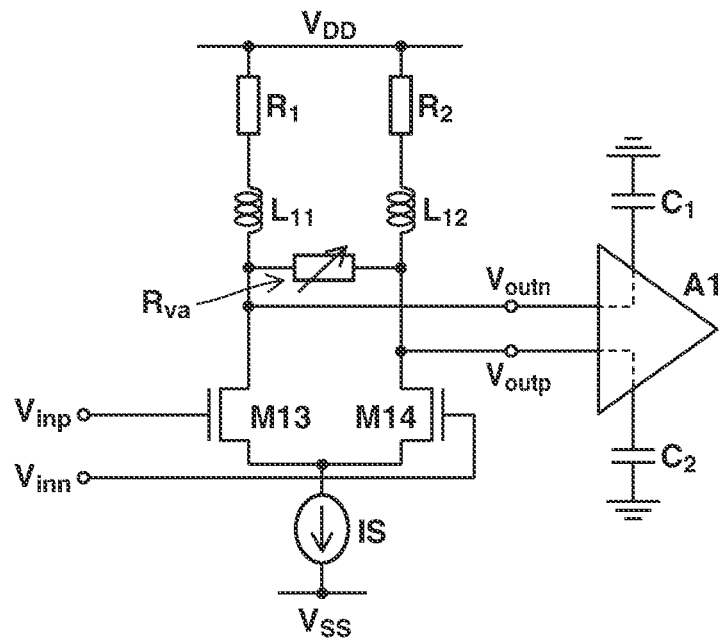
FIG. 25 is a circuit diagram showing the arrangement of a variable gain amplifier according to the 11th embodiment of the present invention.

The 11th embodiment will describe still another example in which a variable gain amplifier is used as at least one of the plurality of differential amplifiers 1 (1-1 to 1-N) described in each of the first to sixth embodiments. FIG. 25 is a circuit diagram showing the arrangement of a variable gain amplifier according to the 11th embodiment of the present invention. The same reference symbols as in FIG. 21 denote the same constituent elements. The difference from the arrangement according to the ninth embodiment shown in FIG. 21 is that a variable resistor $R_{va}$ is provided as a differential resistor of a differential circuit, instead of providing a variable resistor (transistors M15 and M16) as part of the output resistors of the differential pair transistors M13 and M14 of the differential circuit. That is, the variable resistor $R_{va}$ is provided between the inverting output terminal ($V_{outn}$) and non-inverting output terminal ($V_{outp}$) of the variable gain amplifier.

The arrangement according to each of the ninth and 10th embodiments adopts the connection form in which a DC current flows into the variable resistor. Consequently, when the resistance value of the variable resistor changes, the IR drop causes an amount of a voltage drop to change, resulting in changes in DC operating points of the output terminals ($V_{out}$, $V_{outn}$, and $V_{outp}$).

In the 11th embodiment, no DC current flows into the variable resistor $R_{va}$. Thus, even if the resistance value of the variable resistor $R_{va}$ changes, the DC operating points of the inverting output terminal ($V_{outn}$) and non-inverting output terminal ($V_{outp}$) never change.

On the other hand, the variable resistor $R_{va}$ appears to be a differential resistor when viewed from the inverting output terminal ($V_{outn}$) and non-inverting output terminal ($V_{outp}$). Thus, the value of the output resistor of the amplifier changes alternately by changing the resistance value of the variable resistor $R_{va}$, thereby making it possible to implement a variable gain function, similarly to the ninth and 10th embodiments.

Similarly to the ninth and 10th embodiments, the variable resistor $R_{va}$ can be implemented by, for example, a p-type MOS transistor having a gate to which a gain control voltage $V_{GAIN}$ is input, a source connected to the inverting output terminal ($V_{outn}$), and a drain connected to the non-inverting output terminal ($V_{outp}$).

12th Embodiment

Figure 26:
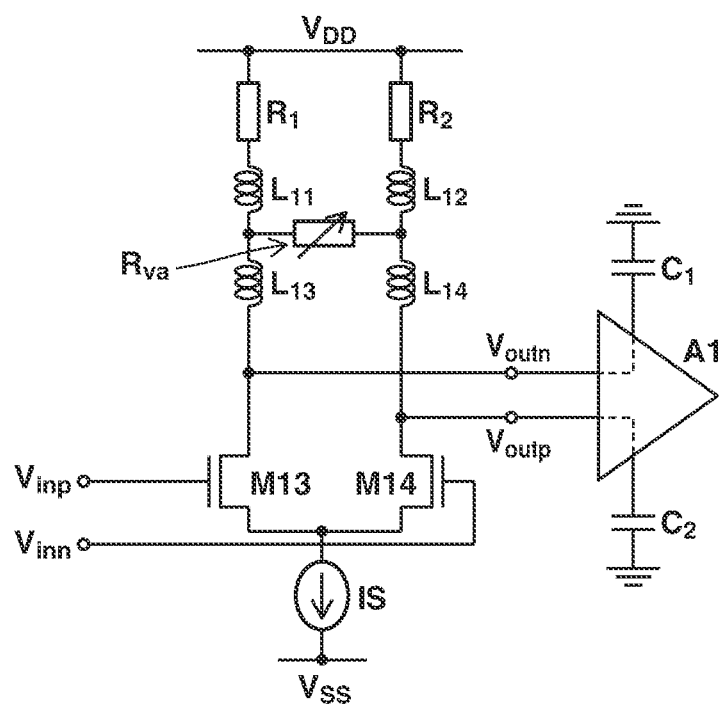
FIG. 26 is a circuit diagram showing the arrangement of a variable gain amplifier according to the 12th embodiment of the present invention.

The 12th embodiment will describe another example in which a variable gain amplifier is used as at least one of the plurality of differential amplifiers 1 (1-1 to 1-N) described in each of the first to sixth embodiments. FIG. 26 is a circuit diagram showing the arrangement of a variable gain amplifier according to the 12th embodiment of the present invention. The same reference symbols as in FIGS. 21 and 25 denote the same constituent elements. The difference from the arrangement according to the 11th embodiment shown in FIG. 25 is that an inductor $L_{13}$ is provided between an inverting output terminal ($V_{outn}$) of the variable gain amplifier and a terminal, on the side of the inverting output terminal ($V_{outn}$), of a series circuit including a resistor $R_1$ and an inductor $L_{11}$, and an inductor $L_{14}$ is provided between a non-inverting output terminal ($V_{outp}$) of the variable gain amplifier and a terminal, on the side of the non-inverting output terminal ($V_{outp}$), of a series circuit including a resistor $R_2$ and an inductor $L_{12}$.

With this arrangement, in the 12th embodiment, it is possible to obtain the effect described in the 10th embodiment and the effect described in the 11th embodiment.

Note that when the arrangement shown in each of FIGS. 21, 23, 25, and 26 is used as at least one of the differential amplifiers 1 (1-1 to 1-N) described in each of the first to sixth embodiments, a terminal to which a positive-side power supply voltage $V_{DD}$ is supplied is connected to a positive-side power supply line L1 or the negative-side power supply terminal of another differential amplifier. In addition, a terminal to which a negative-side power supply voltage $V_{SS}$ is supplied is connected to a negative-side power supply line L2 or the positive-side power supply terminal of another differential amplifier.

Note that each of the ninth to 12th embodiments has explained the example of the arrangement of implementing a variable resistor using a p-type MOS transistor. However, the present invention is not limited to the p-type MOS transistor, and any circuit that can change the resistance value, such as an n-type MOS transistor or series connection of p- or n-type MOS transistor and a constant resistor, can be used.

Each of the ninth to 12th embodiments has explained the arrangement using MOS transistors as amplification transistors (M13 and M14) and variable resistance transistors (M15 and M16). However, the present invention is not limited to this, and bipolar transistors may be used.

Each of the ninth to 12th embodiments has explained the arrangement in which all the source terminals of the amplification transistors are grounded. However, the present invention is not limited to this, and an arrangement in which the source terminals are grounded via a resistor or via a parallel circuit including a resistor and a capacitor is plausible.

13th Embodiment

Figure 27:
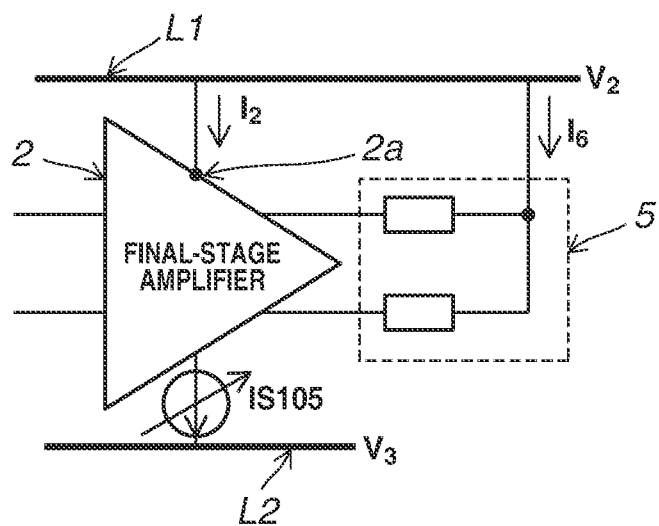
FIG. 27 is a circuit diagram showing an example of connection between an optical modulator and a final-stage differential amplifier of a driver circuit in an optical transmitter according to the 13th embodiment of the present invention.

The 13th embodiment will describe an example of applying the driver circuit explained in each of the first to 12th embodiments to an optical transmitter. FIG. 27 is a circuit diagram showing an example of connection between a final-stage differential amplifier 2 of the driver circuit of the optical transmitter and an optical modulator 5 driven by the driver circuit. When the driver circuit described in each of the first to 12th embodiments is applied to the optical transmitter, the output terminal of the final-stage differential amplifier 2 of the driver circuit is connected to a positive-side power supply line L1 via the optical modulator 5, as shown in FIG. 27.

In recent years, impedance R of a target driven by the driver circuit is not always 50Ω. For example, as for an optical modulator, there is provided a modulator having impedance lower than 50Ω to implement a modulator with a wider band. In the arrangement shown in FIG. 27, the DC operating point of the output terminal of the differential amplifier 2 is given by $V_2-I_6R/2$ using the impedance R of the optical modulator 5. That is, since the operating point of the output terminal of the differential amplifier 2 changes in accordance with the value of the impedance R, the impedance condition of the optical modulator 5 to be driven is restricted.

To cope with this situation, in the 13th embodiment, a variable current source circuit IS105 is provided in the final-stage differential amplifier 2 of the driver circuit. A current flowing into the variable current source circuit IS105 is given by the sum ($I_2+I_6$) of a current $I_2$ flowing into the differential amplifier 2 and a current $I_6$ flowing into the optical modulator 5. It is possible to always keep the DC operating point of the final-stage differential amplifier 2 of the driver circuit constant by controlling the current value by the variable current source circuit IS105 so that $R \times I_6$ stays constant.

Figure 28:
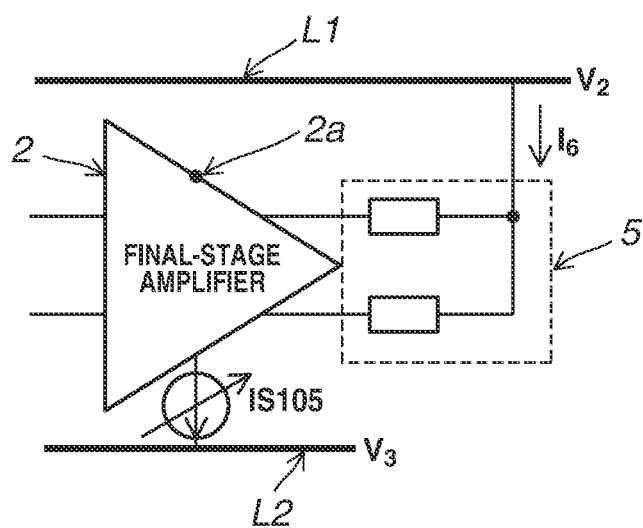
FIG. 28 is a circuit diagram showing another example of the connection between the optical modulator and the final-stage differential amplifier of the driver circuit in the optical transmitter according to the 13th embodiment of the present invention.
Figure 29:
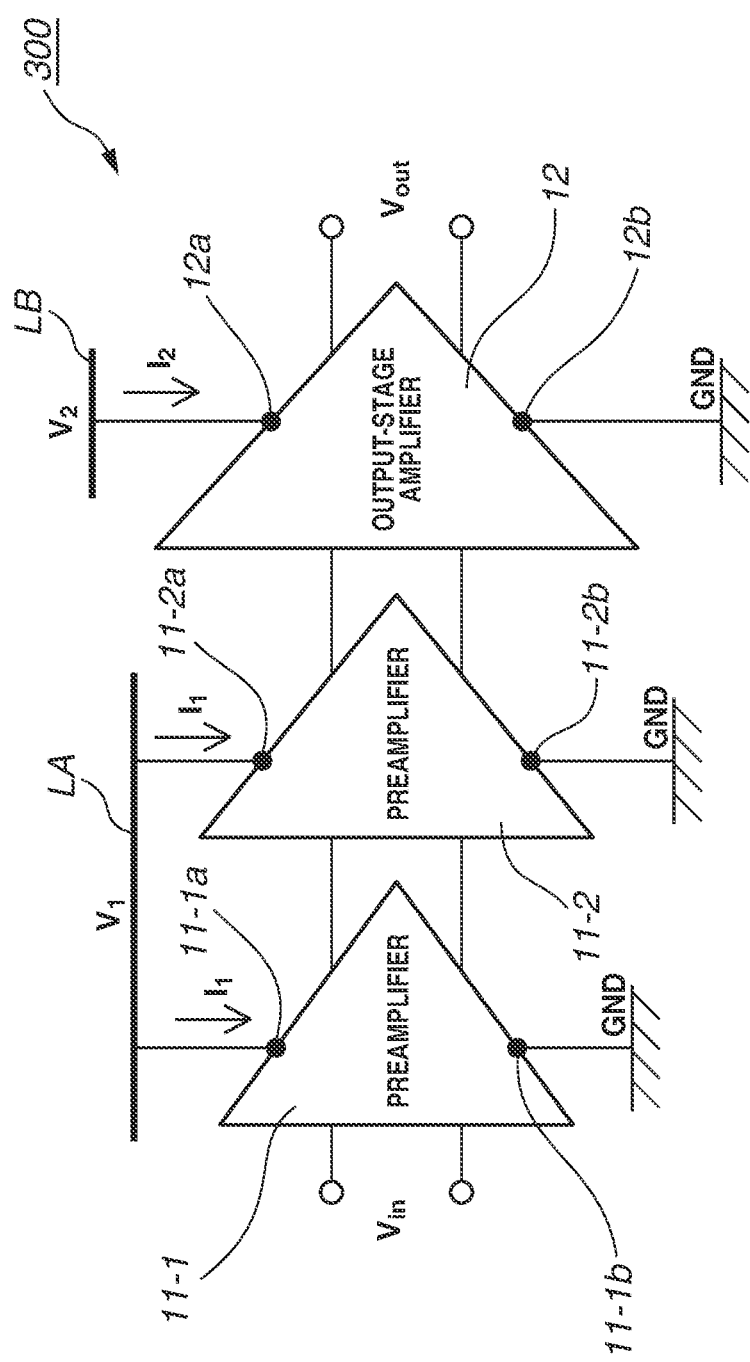
FIG. 29 is a circuit diagram showing the main part of a relevant driver circuit.

As shown in FIG. 28, a positive-side power supply terminal 2a of the differential amplifier 2 need not be connected to the positive-side power supply line L1. In this arrangement shown in FIG. 28, it is possible to supply a current from the positive-side power supply line L1 to the differential amplifier 2 via the optical modulator 5, and to eliminate a matching circuit between the driver circuit and the optical modulator 5, thereby reducing the power consumption. Note that, for example, the arrangement shown in FIG. 16 or 17 can be used as the arrangement of the differential amplifier 2 including the variable current source circuit IS105.

Extension of Embodiments

The present invention has been described above with reference to the embodiments, but is not limited to these embodiments. Various changes understandable by those skilled in the art can be made for the arrangements and details of the present invention without departing from the scope of the invention.

EXPLANATION OF THE REFERENCE NUMERALS AND SIGNS 1-1-1-N, 1A-1E, 2 . . . differential amplifier, 1a . . . positive-side power supply terminal, 1b . . . negative-side power supply terminal, 2a . . . positive-side power supply terminal, 2b . . . negative-side power supply terminal, 3 . . . preamplifier, 4 . . . level shifter, 4a . . . positive-side power supply terminal, 4b . . . negative-side power supply terminal, 5 . . . optical modulator, L1 . . . positive-side power supply line, L2 . . . negative-side power supply line, 100-105, 200-204 . . . driver circuit, M13-M16, M100-

M108 . . . transistor, D100, D101 . . . diode, $R_1$, $R_2$, R100-R104 . . . resistor, $R_{va}$ . . . variable resistor, C100, C101 . . . capacitive element, $L_{11}$-$L_{14}$ . . . inductor, IS, IS100-IS104 . . . current source circuit, IS105 . . . variable current source circuit

The invention claimed is:

1. A driver circuit comprising a plurality of amplifiers cascade-connected so as to sequentially amplify an input signal,
the plurality of amplifiers each including a differential amplifier that comprises a positive-side power supply terminal, a negative-side power supply terminal, and a tail current source formed by a transistor having a gate terminal connected to a fixed potential and a source terminal connected to one of the positive-side power supply terminal and the negative-side power supply terminal,
wherein the plurality of amplifiers except for a final-stage amplifier among the plurality of amplifiers is connected to a positive-side power supply line and a negative-side power supply line in one of a first connection form and a second connection form,
the final-stage amplifier has the negative-side power supply terminal connected to the negative-side power supply line,
the first connection form is a form in which the positive-side power supply terminal of a first-stage amplifier is connected to the positive-side power supply line, the negative-side power supply terminal of an amplifier immediately preceding the final-stage amplifier is connected to the negative-side power supply line, and, as for amplifiers from the first-stage amplifier to the amplifier immediately preceding the final-stage amplifier, the negative-side power supply terminal of a preceding-stage amplifier and the positive-side power supply terminal of an amplifier succeeding the preceding-stage amplifier are connected to each other, and
the second connection form is a form in which the negative-side power supply terminal of the first-stage amplifier is connected to the negative-side power supply line, the positive-side power supply terminal of the amplifier immediately preceding the final-stage amplifier is connected to the positive-side power supply line, and, as for the amplifiers from the first-stage amplifier to the amplifier immediately preceding the final-stage amplifier, the positive-side power supply terminal of the preceding-stage amplifier and the negative-side power supply terminal of the amplifier succeeding the preceding-stage amplifier are connected to each other.

2. The driver circuit according to claim 1, wherein a power supply voltage supplied between the positive-side power supply terminal and the negative-side power supply terminal of each of the amplifiers from the first-stage amplifier to the final-stage amplifier increases in an order from the first-stage amplifier to the final-stage amplifier.

3. The driver circuit according to claim 1, further comprising a level shifter configured to adjust a level of the signal on at least one of paths of the signal between the amplifiers from the first-stage amplifier to the amplifier immediately preceding the final-stage amplifier,
wherein in the first connection form, a positive-side power supply terminal of the level shifter is connected to the positive-side power supply terminal of an amplifier immediately preceding the level shifter, and a negative-side power supply terminal of the level shifter is connected to the negative-side power supply terminal of an amplifier immediately succeeding the level shifter, and
in the second connection form, the positive-side power supply terminal of the level shifter is connected to the positive-side power supply terminal of the amplifier immediately succeeding the level shifter, and the negative-side power supply terminal of the level shifter is connected to the negative-side power supply terminal of the amplifier immediately preceding the level shifter.

4. The driver circuit according to claim 1, wherein the first-stage amplifier is formed from a group of a plurality of cascade-connected amplifiers.

5. The driver circuit according to claim 1, wherein
at least two of the amplifiers from the first-stage amplifier to the amplifier immediately preceding the final-stage amplifier are each formed from a group of a plurality of cascade-connected amplifiers, and
the number of stages of the amplifiers forming the preceding-stage group is equal to or greater than the number of stages of the amplifiers forming the succeeding-stage group.

6. The driver circuit according to claim 4, wherein a current flowing into each of the amplifiers forming the group increases toward the later-stage amplifier.

7. The driver circuit according to claim 1, wherein
at least one of the amplifiers from the first-stage amplifier to the amplifier immediately preceding the final-stage amplifier is a variable gain amplifier, and
the variable gain amplifier includes
a first transistor for amplification to which a non-inverting input voltage signal is input, including an output that is connected to an inverting output terminal of the variable gain amplifier,
a second transistor for amplification to which an inverting input voltage signal is input, including an output that is connected to a non-inverting output terminal of the variable gain amplifier,
a first variable resistor connected between the positive-side power supply line and the inverting output terminal,
a second variable resistor connected between the positive-side power supply line and the non-inverting output terminal,
a first series circuit connected between the positive-side power supply line and the inverting output terminal, and including a first resistor and a first inductor, and
a second series circuit connected between the positive-side power supply line and the non-inverting output terminal, and including a second resistor and a second inductor.

8. The driver circuit according to claim 7, further comprising:
a third inductor between the inverting output terminal of the variable gain amplifier and a terminal on a side of the inverting output terminal of the first series circuit, and a terminal on a side of the inverting output terminal of the first variable resistor; and
a fourth inductor between the non-inverting output terminal of the variable gain amplifier and a terminal on a side of the non-inverting output terminal of the second series circuit, and a terminal on a side of the non-inverting output terminal of the second variable resistor.

9. The driver circuit according to claim 1, wherein
at least one of the amplifiers from the first-stage amplifier to the amplifier immediately preceding the final-stage amplifier is a variable gain amplifier, and
the variable gain amplifier includes
a first transistor for amplification to which a non-inverting input voltage signal is input, including an output that is connected to an inverting output terminal of the variable gain amplifier,
a second transistor for amplification to which an inverting input voltage signal is input, including an output that is connected to a non-inverting output terminal of the variable gain amplifier,
a variable resistor connected between the inverting output terminal and the non-inverting output terminal,
a first series circuit connected between the positive-side power supply line and the inverting output terminal, and including a first resistor and a first inductor, and
a second series circuit connected between the positive-side power supply line and the non-inverting output terminal, and including a second resistor and a second inductor.

10. The driver circuit according to claim 9, further comprising:
a third inductor between the inverting output terminal of the variable gain amplifier and a terminal on a side of the inverting output terminal of the first series circuit; and
a fourth inductor between the non-inverting output terminal of the variable gain amplifier and a terminal on a side of the non-inverting output terminal of the second series circuit.

11. The driver circuit according to claim 1, wherein the final-stage amplifier has the positive-side power supply terminal connected to the positive-side power supply line.

12. An optical transmitter comprising:
a driver circuit defined in claim 1; and
an optical modulator configured to be driven by the driver circuit,
wherein an output terminal of a final-stage amplifier is connected to a positive-side power supply line via the optical modulator.

13. The driver circuit according to claim 2, further comprising a level shifter configured to adjust a level of the signal on at least one of paths of the signal between the amplifiers from the first-stage amplifier to the amplifier immediately preceding the final-stage amplifier,
wherein in the first connection form, a positive-side power supply terminal of the level shifter is connected to the positive-side power supply terminal of an amplifier immediately preceding the level shifter, and a negative-side power supply terminal of the level shifter is connected to the negative-side power supply terminal of an amplifier immediately succeeding the level shifter, and
in the second connection form, the positive-side power supply terminal of the level shifter is connected to the positive-side power supply terminal of the amplifier immediately succeeding the level shifter, and the negative-side power supply terminal of the level shifter is connected to the negative-side power supply terminal of the amplifier immediately preceding the level shifter.

14. The driver circuit according to claim 2, wherein the first-stage amplifier is formed from a group of a plurality of cascade-connected amplifiers.

15. The driver circuit according to claim 2, wherein
at least two of the amplifiers from the first-stage amplifier to the amplifier immediately preceding the final-stage amplifier are each formed from a group of a plurality of cascade-connected amplifiers, and
the number of stages of the amplifiers forming the preceding-stage group is equal to or greater than the number of stages of the amplifiers forming the succeeding-stage group.

16. The driver circuit according to claim 5, wherein a current flowing into each of the amplifiers forming the group increases toward the later-stage amplifier.

17. The driver circuit according to claim 2, wherein
at least one of the amplifiers from the first-stage amplifier to the amplifier immediately preceding the final-stage amplifier is a variable gain amplifier, and
the variable gain amplifier includes
a first transistor for amplification to which a non-inverting input voltage signal is input, including an output that is connected to an inverting output terminal of the variable gain amplifier,
a second transistor for amplification to which an inverting input voltage signal is input, including an output that is connected to a non-inverting output terminal of the variable gain amplifier,
a first variable resistor connected between the positive-side power supply line and the inverting output terminal,
a second variable resistor connected between the positive-side power supply line and the non-inverting output terminal,
a first series circuit connected between the positive-side power supply line and the inverting output terminal, and including a first resistor and a first inductor, and
a second series circuit connected between the positive-side power supply line and the non-inverting output terminal, and including a second resistor and a second inductor.

18. The driver circuit according to claim 17, further comprising:
a third inductor between the inverting output terminal of the variable gain amplifier and a terminal on a side of the inverting output terminal of the first series circuit, and a terminal on a side of the inverting output terminal of the first variable resistor; and
a fourth inductor between the non-inverting output terminal of the variable gain amplifier and a terminal on a side of the non-inverting output terminal of the second series circuit, and a terminal on a side of the non-inverting output terminal of the second variable resistor.

19. The driver circuit according to claim 2, wherein
at least one of the amplifiers from the first-stage amplifier to the amplifier immediately preceding the final-stage amplifier is a variable gain amplifier, and
the variable gain amplifier includes
a first transistor for amplification to which a non-inverting input voltage signal is input, including an output that is connected to an inverting output terminal of the variable gain amplifier,
a second transistor for amplification to which an inverting input voltage signal is input, including an output that is connected to a non-inverting output terminal of the variable gain amplifier,
a variable resistor connected between the inverting output terminal and the non-inverting output terminal, a first series circuit connected between the positive-side power supply line and the inverting output terminal, and including a first resistor and a first inductor, and a second series circuit connected between the positive-side power supply line and the non-inverting output terminal, and including a second resistor and a second inductor.

20. The driver circuit according to claim 19, further comprising:

a third inductor between the inverting output terminal of the variable gain amplifier and a terminal on a side of the inverting output terminal of the first series circuit; and a fourth inductor between the non-inverting output terminal of the variable gain amplifier and a terminal on a side of the non-inverting output terminal of the second series circuit.

* * * * *